United States Patent
Yoon et al.

(10) Patent No.: US 11,309,375 B2
(45) Date of Patent: Apr. 19, 2022

(54) DISPLAY PANEL

(71) Applicant: Samsung Display Co., Ltd., Yongin-si (KR)

(72) Inventors: Youngsoo Yoon, Yongin-si (KR); Wonkyu Kwak, Yongin-si (KR); Jihyun Ka, Yongin-si (KR); Dongeup Lee, Yongin-si (KR); Yunkyeong In, Yongin-si (KR); Hyunji Cha, Yongin-si (KR); Minhee Choi, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 71 days.

(21) Appl. No.: 16/576,648

(22) Filed: Sep. 19, 2019

(65) Prior Publication Data

US 2020/0273938 A1    Aug. 27, 2020

(30) Foreign Application Priority Data

Feb. 27, 2019    (KR) .................. 10-2019-0023294

(51) Int. Cl.
*H01L 27/32* (2006.01)
*H01L 51/00* (2006.01)

(52) U.S. Cl.
CPC ...... *H01L 27/3276* (2013.01); *H01L 51/0096* (2013.01)

(58) Field of Classification Search
CPC ............. H01L 51/0096; H01L 51/5281; H01L 27/323; H01L 27/3276; H01L 51/5246; H01L 27/3281; H01L 27/3244; H01L 27/3246; H01L 27/326; H01L 51/5256; H01L 51/5012; H01L 51/5056; H01L 51/5072; H01L 51/5218; H01L 27/3272; H01L 51/5234; Y02E 10/549; G09G 3/2092; G09G 3/3291; G09G 3/3266; G09G 3/3674; G09G 3/3677; G02F 1/13; G02F 1/136286; G02F 1/134309; G02F 1/13338;
(Continued)

(56) References Cited

U.S. PATENT DOCUMENTS 8,368,074 B2    2/2013    Koo
2009/0051636 A1    2/2009    Natori
(Continued)

FOREIGN PATENT DOCUMENTS

JP    2009-47902 A    3/2009
KR    10-1636793 B1    7/2016
(Continued)

*Primary Examiner* — Mouloucoulaye Inoussa
(74) *Attorney, Agent, or Firm* — Lewis Roca Rothgerber Christie LLP

(57) ABSTRACT

A display panel includes a substrate including a display area and a first area in the display area; a plurality of pixels in the display area, wherein the plurality of pixels includes a first group of first pixels adjacent to the first area, and each of the first pixels includes a first semiconductor layer, wherein the first semiconductor layer of each of the first pixels is connected to the first semiconductor layer of another one of the first pixels in a first direction to form a plurality of first rows arranged on the substrate, and the plurality of first rows are connected to a first connection line extending in a second direction that crosses the first direction.

20 Claims, 28 Drawing Sheets

(58) Field of Classification Search
CPC ...... G06F 3/0412; G06F 3/044; G06F 3/0448;
G06F 3/0418
USPC ...... 257/59, 232; 349/143, 153, 190, 87, 55,
349/232
See application file for complete search history.

(56) References Cited

U.S. PATENT DOCUMENTS

| | | |
|---|---|---|
| 2016/0202515 A1* | 7/2016 | Watanabe ............... G06F 1/169 |
| | | 349/153 |
| 2016/0216838 A1* | 7/2016 | Aina ..................... G06F 3/0418 |
| 2017/0154566 A1* | 6/2017 | Ryoo .................. G09G 3/3648 |
| 2017/0372661 A1* | 12/2017 | Gu ....................... H01L 27/3276 |
| 2018/0090061 A1* | 3/2018 | Kim ..................... G09G 3/3233 |
| 2018/0158417 A1* | 6/2018 | Xiang ................... G09G 3/3233 |
| 2019/0051670 A1* | 2/2019 | Bei ..................... H01L 27/3276 |
| 2019/0235668 A1* | 8/2019 | Ye ....................... G06F 3/04164 |
| 2019/0285954 A1* | 9/2019 | Yoshida ............ G02F 1/136286 |

FOREIGN PATENT DOCUMENTS

| | | |
|---|---|---|
| KR | 10-2017-0137230 A | 12/2017 |
| KR | 10-2018-0049296 A | 5/2018 |

* cited by examiner

DISPLAY PANEL

CROSS-REFERENCE TO RELATED APPLICATION

This application claims priority to and the benefit of Korean Patent Application No. 10-2019-0023294, filed on Feb. 27, 2019, in the Korean Intellectual Property Office (KIPO), the entire disclosure of which is incorporated herein in its entirety by reference.

BACKGROUND

1. Field

One or more embodiments relate to a display panel including a first area in an inner portion of a display area.

2. Description of the Related Art

Recently, display apparatuses have been used for various purposes. In addition, due to the decreased thickness and the light weight of display apparatuses, display apparatuses have become more widely used.

As a display area occupies a greater portion of a display apparatus, additional functions are grafted or linked to the display apparatus. In order to add various functions while increasing a size of the display area, display apparatuses including a display area in which various suitable components may be arranged have been researched and studied.

SUMMARY

Aspects of one or more embodiments are directed to a display panel having a display area including a first area in which various kinds of components may be arranged, and a display apparatus including the display panel. However, the above aspects are exemplary, and the scope of the present disclosure is not limited by the aspects.

Additional aspects will be set forth in part in the description which follows and, in part, may be apparent from the description, or may be learned by practice of the embodiments.

According to one or more embodiments, a display panel includes: a substrate including a display area and a first area in the display area; and a plurality of pixels in the display area, wherein the plurality of pixels includes a first group of first pixels adjacent to the first area, and each of the first pixels includes a first semiconductor layer, wherein the first semiconductor layer of each of the first pixels is connected to the first semiconductor layer of another one of the first pixels in a first direction to form a plurality of first rows arranged on the substrate, and wherein the plurality of first rows is connected to a first connection line extending in a second direction that crosses the first direction.

The each of the first rows may include a first end portion adjacent to the first area and a second end portion opposite to the first end portion, and the first connection line may be connected to at least one of the first end portion and the second end portion.

The plurality of pixels may include a first neighboring pixel group adjacent to the first group, and each of the pixels in the neighboring pixel group may each include a semiconductor layer, wherein the semiconductor layer of each of the pixels in the first neighboring pixel group may be connected to the semiconductor layer of another one of the pixels in the first neighboring pixel group in the first direction to form a plurality of rows arranged on the substrate, and wherein the first connection line is connected to the plurality of rows in the first neighboring pixel group.

A total area of the first semiconductor layers in the first group is different from a total area of the semiconductor layers in the first neighboring pixel group.

The first connection line and the first semiconductor layers include a same material.

The plurality of pixels may include a second group of second pixels spaced apart from the first group of first pixels with the first area between the first group and the second group, wherein each of the second pixels includes a second semiconductor layer, and wherein each of the second semiconductor layer of each of the second pixels is connected to the second semiconductor layer of another one of the second pixels in the first direction to form a plurality of second rows arranged on the substrate.

The display panel may further include a second connection line extending in the second direction, and each of the plurality of second rows may be connected to the second connection line.

Each of the second rows may include a first end portion adjacent to the first area and a second end portion opposite to the first end portion, and wherein the second connection line may be connected to at least one of the first end portion and the second end portion of each of the plurality of second rows.

The plurality of pixels may further include a second neighboring pixel group adjacent to the second group, and each of the pixels in the second neighboring pixel group includes a semiconductor layer, wherein the semiconductor layer of each of the pixels in the second neighboring pixel group may be connected to the semiconductor layer of another one of the pixels in the second neighboring pixel group in the first direction to form a plurality of rows arranged on the substrate, and wherein the second connection line may be connected to the plurality of rows in the second neighboring pixel group.

The second connection line and the second semiconductor layers may include a same material.

According to one or more embodiments, a display panel includes: a substrate including a first area and a second area; a plurality of first rows in the second area, each of the first rows including a plurality of first semiconductor layers connected to one another in a first direction; a plurality of second rows in the second area, each of the second rows including a plurality of second semiconductor layers connected to one another in the first direction; and a first connection line that is connected to the first rows and extends in a second direction that crosses the first direction.

The first connection line and the first semiconductor layers may include a same material.

The each of the first rows each may include a first end portion adjacent to the first area and a second end portion opposite to the first end portion, and wherein the first connection line may be connected to at least any one of the first end portion and the second end portion.

The display panel may further include a plurality of first neighboring rows that is adjacent to the plurality of first rows, each of the first neighboring rows including a plurality of semiconductor layers that is connected to one another in the first direction, and the first connection line is connected to the plurality of first neighboring rows.

The plurality of first semiconductor layers and the plurality of semiconductor layers may be respectively connected to neighboring first semiconductor layers or semiconductor layers in the second direction.

The plurality of first rows and the plurality of second rows may be apart from one another with the first area between the plurality of first rows and the plurality of second rows.

The plurality of first semiconductor layers and the plurality of second semiconductor layers may be arranged stepwise in an area adjacent to the first area.

The display panel may further include a second connection line connected to the plurality of second rows and extending in a second direction that crosses the first direction.

The second connection line and the plurality of second semiconductor layers may include a same material.

The display panel may further include a plurality of second neighboring rows that is adjacent to the plurality of second rows, each of the second neighboring rows including a plurality of second semiconductor layers that are connected to one another in the first direction, and the second connection line is connected to the plurality of second neighboring rows.

Aspects and features other than the descriptions will be apparent from the attached drawings, claims, and detailed descriptions.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
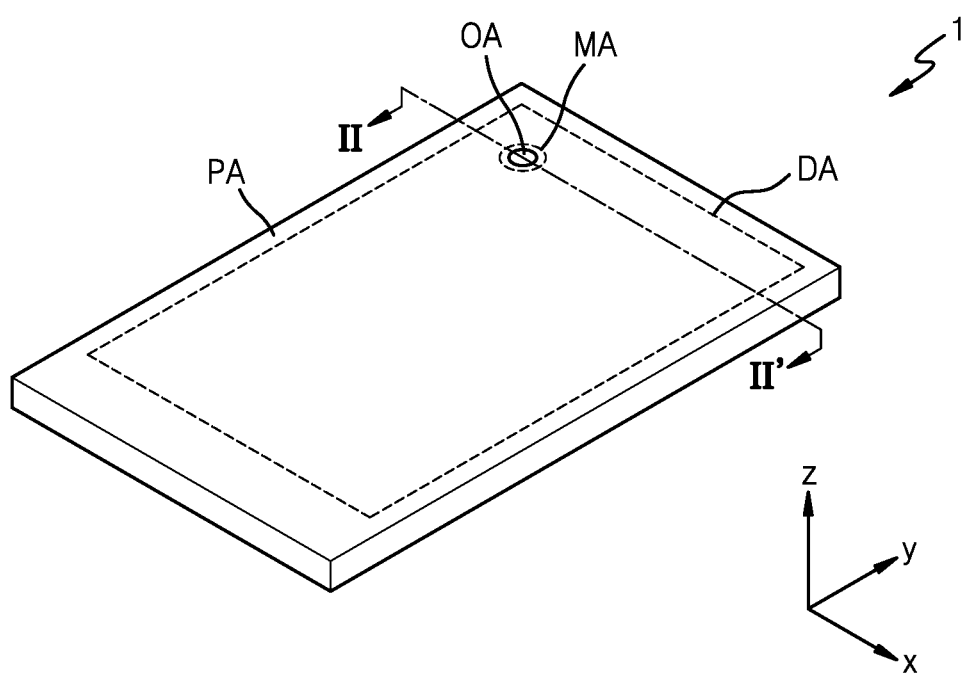
FIG. 1 is a schematic perspective view showing a display apparatus according to an embodiment.

As the embodiments allows for various suitable changes, particular embodiments will be illustrated in the drawings and described in more detail in the written description. Features of the embodiments and achieving the same may become apparent with reference to embodiments described in detail hereinafter and in the drawings. However, the embodiments are not limited to the embodiments set forth herein and may be embodied in various forms. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" indicates any and all combinations of one or more of the associated listed items. Expressions such as "at least one of," when preceding a list of elements, modify the entire list of elements and do not modify the individual elements of the list. Further, the use of "may" when describing embodiments of the inventive concept refers to "one or more embodiments of the inventive concept."

Hereinafter, embodiments will be described in more detail with reference to the attached drawings. Like reference numerals in the drawings denote like elements, and repeated descriptions thereof will be omitted.

In embodiments set forth herein, terms such as "first," "second," "third," and "fourth" are not used in a limited sense and are used only to distinguish one component from another.

An expression used in the singular encompasses the expression of the plural, unless it has a clearly different meaning in the context.

In embodiments set forth herein, terms such as "including", "comprising," and "having" are intended to indicate the existence of the features or components disclosed in the specification, and are not intended to preclude the possibility that one or more features or components may exist or may be added.

It will be understood that when a layer, region, or component is referred to as being "formed on" another layer, region, or component, it may be directly or indirectly formed on the other layer, region, or component. That is, for example, intervening layers, regions, or components may be present.

Sizes of components in the drawings may be exaggerated for convenience of explanation. In other words, because sizes and thicknesses of components in the drawings are arbitrarily illustrated for convenience of explanation, the embodiments are not limited thereto.

When a certain embodiment may be implemented differently, a specific process order may be performed differently from the described order. For example, two consecutively described processes may be performed substantially at the same time or performed in an order opposite to the described order.

In the present specification, "A and/or B" indicates "A", "B", or "A and B". In the present specification, "at least one of A and B" indicates "A", "B", or "A and B".

In embodiments set forth herein, when a layer, region, or component is connected to another layer, region, or component, the layers, regions, or components may be directly connected to each other, and the layers, regions, or components may also be indirectly connected to each other with another layer, region, or component therebetween. For example, in the present specification, when a layer, region, or component is electrically connected to another layer, region, or component, the layers, regions, or components may be directly and electrically connected to each other, and the layers, regions, or components may also be indirectly and electrically connected to each other with another layer, region, or component therebetween.

As used herein, the term "substantially," "about," and similar terms are used as terms of approximation and not as terms of degree, and are intended to account for the inherent deviations in measured or calculated values that would be recognized by those of ordinary skill in the art.

Spatially relative terms, such as "beneath", "below", "lower", "downward", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

As used herein, the terms "use," "using," and "used" may be considered synonymous with the terms "utilize," "utilizing," and "utilized," respectively.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

FIG. 1 is a schematic perspective view showing a display apparatus 1 according to an embodiment.

Figure 2A:
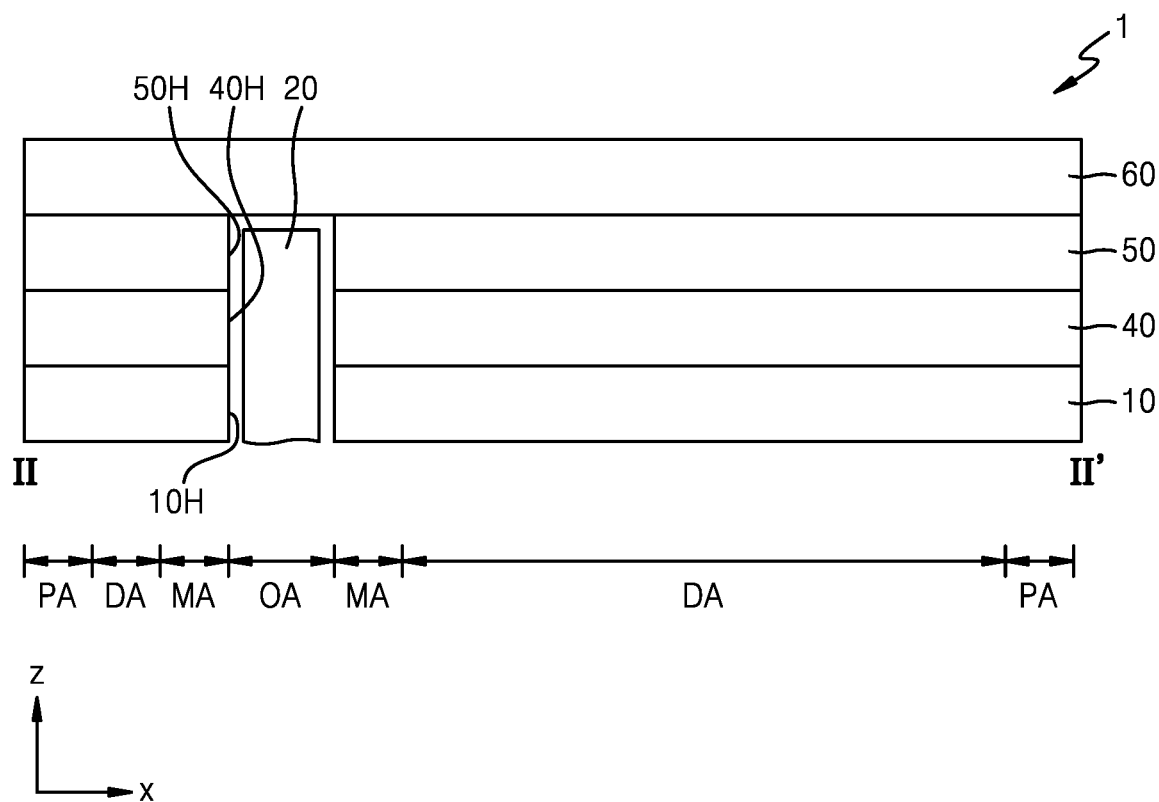
FIGS. 2A and 2B are brief cross-sectional views each showing a display apparatus according to an embodiment.
Figure 2B:
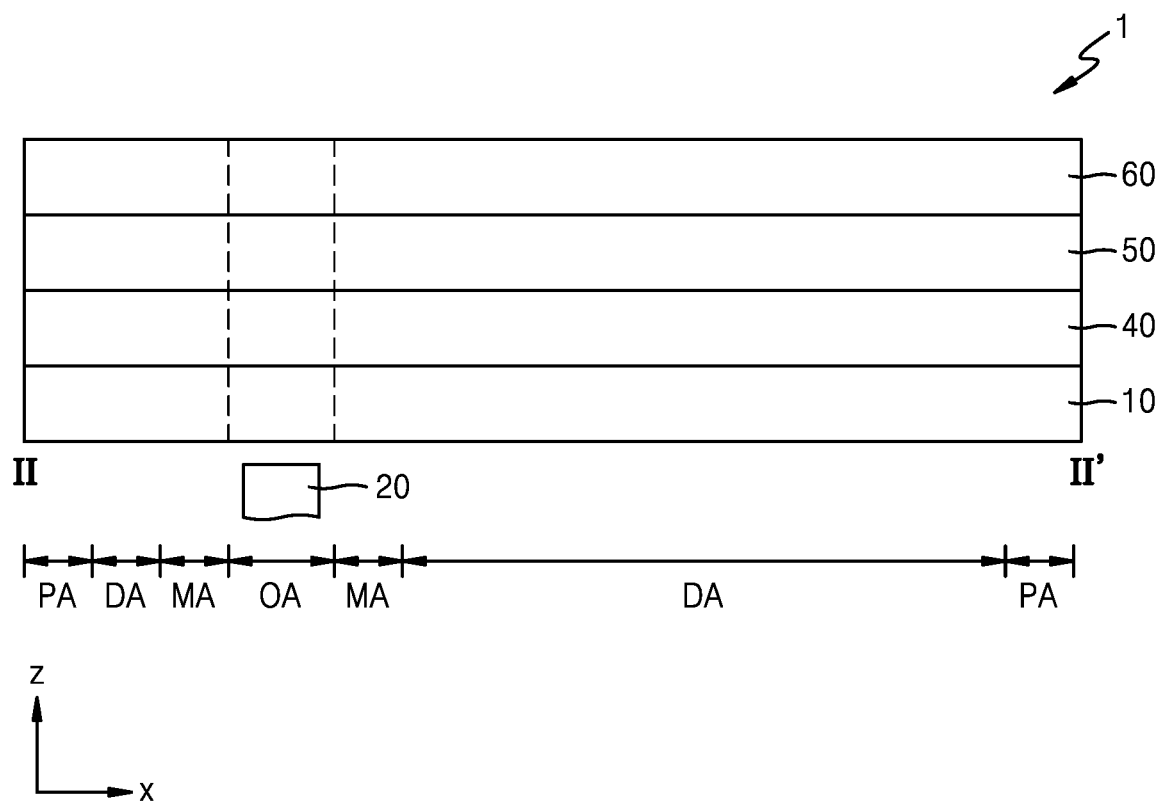

Referring to FIG. 1, the display apparatus 1 includes a first area OA and a display area (or a second area) DA. In other words, a second area at least partially surrounds the first area OA. The display apparatus 1 may provide an image by using light that is emitted from a plurality of pixels arranged in the display area DA. In FIG. 1, one first area OA is arranged in an inner portion of the display area DA, and the first area OA may be entirely surrounded by the display area DA. The first area OA may be an area in which a component to be described later with reference to FIGS. 2A and 2B is arranged.

A middle area (or a third area) MA may be arranged between the first area OA and the display area DA, and the display area DA may be surrounded by a peripheral area (or a fourth area) PA. The middle area MA and the peripheral area PA may be non-display areas in which pixels are not arranged. The middle area MA may be entirely surrounded by the display area DA, and the display area DA may be entirely surrounded by the peripheral area PA.

Hereinafter, an organic light-emitting display is explained as an example of the display apparatus 1 according to an embodiment, but the display apparatus 1 is not limited thereto. In an embodiment, the display apparatus 1 may be an inorganic light-emitting display, an inorganic EL display, or a quantum dot light-emitting display. For example, an emission layer of a display element that is provided in the display apparatus 1 may include an organic material, an inorganic material, or a quantum dot. In one or more embodiments, the emission layer may include an organic material and a quantum dot, or an inorganic material and a quantum dot.

In FIG. 1, a first area OA that is approximately circular is illustrated, but the embodiments are not limited thereto. There may be one or more first areas OA, and each of the one or more first areas OA may be any suitable shape, for example, a circle, an oval, a polygon, a star-shape, and/or a diamond-shape.

FIGS. 2A and 2B are brief cross-sectional views each showing the display apparatus 1 according to an embodiment and may correspond to cross-sections of the display apparatus 1 taken along the line II-II' shown in FIG. 1.

Referring to FIGS. 2A and 2B, the display apparatus 1 may include a display panel 10, an input sensing layer 40 arranged on the display panel 10, and an optical function layer 50. The display panel 10, the input sensing layer 40, and the optical function layer 50 may be covered by a window 60. The display apparatus 1 may include various kinds of electronic devices such as a mobile phone, a laptop computer, or a smart watch.

The display panel 10 may display an image. The display panel 10 includes pixels arranged in the display area DA. The pixels may each include a display element and a pixel circuit connected to the display element. The display element may include an organic light-emitting diode, a quantum dot organic light-emitting diode, or the like.

The input sensing layer 40 may acquire an external input, for example, coordinate information according to a touch event. The input sensing layer 40 may include a sensing electrode (or a touch electrode) and trace lines connected to the sensing electrode. The input sensing layer 40 may be arranged on the display panel 10. The input sensing layer 40 may sense an external input by a mutual cap method (e.g., a mutual capacitance method) and/or a self-cap method (e.g., a self-capacitance method).

The input sensing layer 40 may be formed either directly on the display panel 10 or separately formed and then combined to the display panel 10 by using an adhesive layer such as an optical clear adhesive. For example, the input sensing layer 40 may be continuously formed after a process of forming the display panel 10 (e.g., the optical function layer 50 may be continuously formed with the display panel 10. In this case, the input sensing layer 40 may be understood as a portion of the display panel 10, and no adhesive layer may be between the input sensing layer 40 and the display panel 10. Although FIG. 2A shows an embodiment in which the input sensing layer 40 is between the display panel 10 and the optical function layer 50, in another embodiment, the input sensing layer 40 may be arranged on the optical function layer 50.

The optical function layer 50 may include a reflection prevention layer. The reflection prevention layer may reduce a reflectance (e.g., a light reflectance value) of light (external light) incident on the display panel 10 from outside through the window 60. The reflection prevention layer may include a retarder and a polarizer. The retarder may include a film type or a liquid crystal coating type, and may include a λ/2 retarder and/or a λ/4 retarder. The polarizer may also include a film type or a liquid crystal coating type. A film-type polarizer may include a stretched-type synthetic resin film, and a liquid crystal coating-type polarizer may include liquid crystals arranged into a certain arrangement. The retarder and the polarizer may further include a protection film. The protection film of the retarder and polarizer may be defined as a base layer of a reflection prevention layer.

In an embodiment, the reflection prevention layer may include a black matrix and color filters. The color filters may be arranged in consideration of colors of light that are emitted from each pixel of the display panel 10. Each of the color filters may include a pigment or dye of red, green, or blue color. Alternatively, each of the color filters may further include a quantum dot beside the pigment or dye. Alternatively, some of the color filters may include scattered particles such as titanium oxide instead of the pigment or dye described above.

In an embodiment, the reflection prevention layer may include a destructive interference structure. The destructive interference structure may include a first reflective layer and a second reflective layer that are respectively arranged on different layers. A first reflected light and a second reflected light respectively reflected from the first reflective layer and the second reflective layer may undergo destructive interference. Accordingly, a reflectance of external light incident on the display panel 10 may be reduced.

The optical function layer 50 may include a lens layer. The lens layer may improve light-emitting efficiency of light that is emitted from the display panel 10 or reduce a color deviation. The lens layer may include a layer having a concave or protruding lens shape and/or a plurality of layers having different refractive indices. The optical function layer 50 may include the reflection prevention layer and/or the lens layer.

In an embodiment, the optical function layer 50 may be continuously formed after a process of forming the display panel 10 and/or the input sensing layer 40 (e.g., the optical function layer 50 may be continuously formed with the display panel 10 and the input sensing layer 40). In this case, an adhesion layer may not be located between the optical function layer 50 and the display panel 10 and/or the input sensing layer 40.

The display panel 10, the input sensing layer 40, and/or the optical functional layer 50 may each include an opening. In this regard, FIG. 2A shows an embodiment in which the display panel 10, the input sensing layer 40, and the optical function layer 50 respectively include a first opening 10H, a second opening 40H, and a third opening 50H that overlap one another. The first opening 10H, the second opening 40H, and the third opening 50H are arranged to correspond to the first area OA. In an embodiment, one or more of the display panel 10, the input sensing layer 40, and the optical function layer 50 may not include an opening. For example, one or two components selected from among the display panel 10, the input sensing layer 40, and the optical function layer 50 may not include an opening. Alternatively, the display panel 10, the input sensing layer 40, and the optical function layer 50 may include an opening as shown in FIG. 2B.

As described in one or more embodiments above, the first area OA may be a type of component area in which a component 20 for adding various suitable functions to the display apparatus 1 is located (e.g., a sensor area, a camera area, a speaker area, and/or the like). The component 20 may be in the first opening 10H, the second opening 40H, and the third opening 50H, as shown in FIG. 2A. Alternatively, the component 20 may be arranged under the display panel 10, as shown in FIG. 2B.

The component 20 may include an electronic element. For example, the component 20 may include an electronic element that uses light or sound. For example, the electronic element may include a sensor that outputs and/or receives light such as an infrared ray sensor, a camera that receives light and captures an image, a sensor that measures a distance by outputting and sensing light or sounds or recognizes a fingerprint, a small-sized lamp that outputs light, a speaker that outputs sound, and the like. An electronic element using light may use light having various suitable wavelength bands, such as visible light, infrared light, ultraviolet light, and the like. In one or more embodiments, the first area OA may be understood as a transmission area through which light and/or sound output from the component 20 to the outside or proceeding from the outside to the electronic element of the component 20 may be transmitted.

In an embodiment, when the display apparatus 1 is used as a smart watch or an instrument panel of a vehicle, the component 20 may be a member such as a hand of a watch or a pin instructing certain information (e.g., a velocity of a vehicle). When the display apparatus 1 includes hands of a clock or an instrument panel for a vehicle, the component 20 may be exposed toward outside through the window 60, and the window 60 may include an opening corresponding to the first area OA.

As described above, in one or more embodiments, the component 20 may include element(s) related to functions of the display panel 10 or elements such as accessories for improving aesthetic impression of the display panel 10. Although not shown in FIGS. 2A and 2B, an optical clear adhesive and the like may be located between the window 60 and the optical function layer 50.

FIGS. 3A-3D are schematic cross-sectional views showing the display panel 10 according to an embodiment.

Figure 3A:
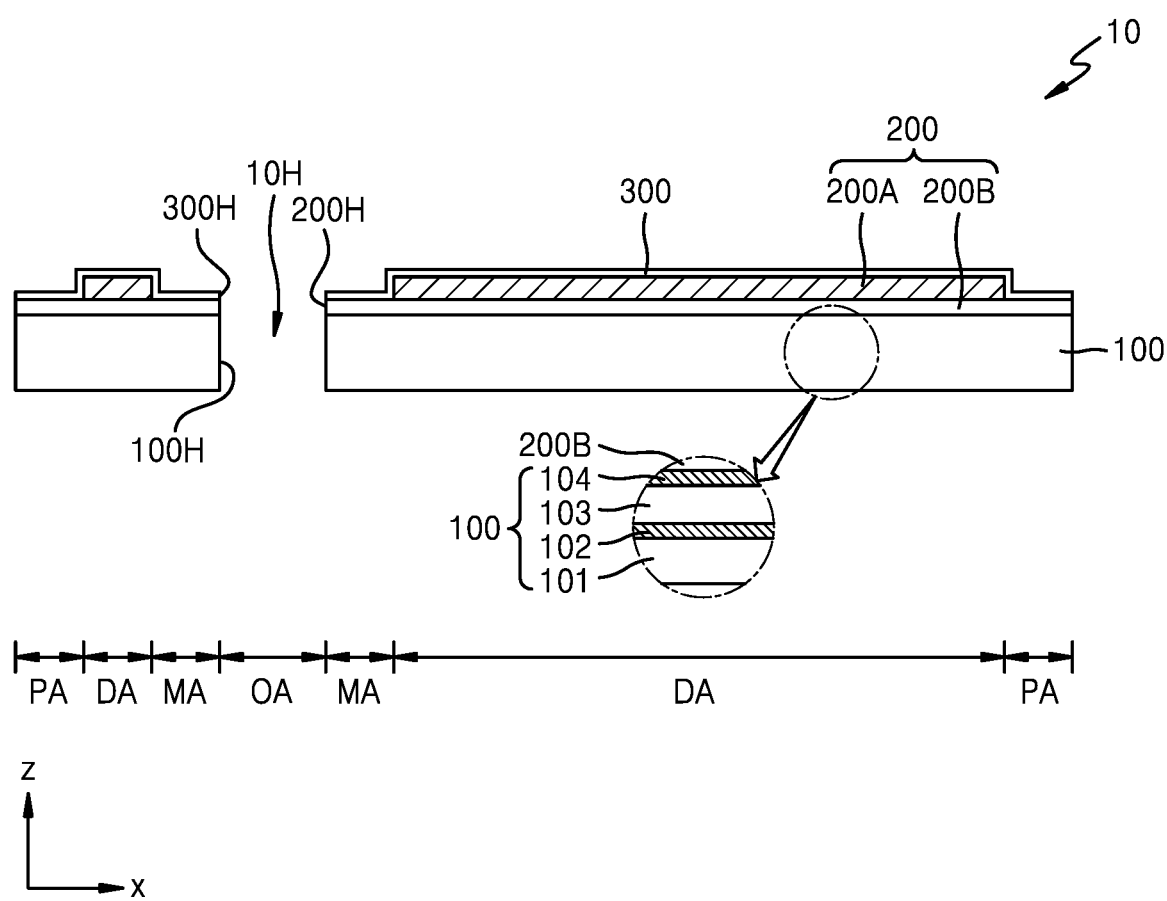
FIGS. 3A-3D are schematic cross-sectional views each showing a display panel according to an embodiment.

Referring to FIG. 3A, the display panel 10 includes a display layer 200 arranged on a substrate 100. The substrate 100 may include glass and/or a polymer resin. The substrate 100 may include a single layer or multiple layers. For example, as shown in an enlarged view of FIG. 3A, the substrate 100 may include a first base layer 101, a first barrier layer 102, a second base layer 103, and a second barrier layer 104.

The first base layer 101 and the second base layer 103 may each include a polymer resin. For example, the first base layer 101 and the second base layer 103 may include a high molecular weight resin such as polyethersulfone (PES), polyarylate (PAR), polyetherimide (PEI), polyethylene naphthalate (PEN), polyethylene terephthalate (PET), polyethylene sulfide (PPS), polyimide (PI), polycarbonate (PC), cellulose triacetate (TAC), cellulose acetate propionate (CAP), and the like. The first base layer 101 and the second base layer 103 may include a transparent polymer resin.

The first barrier layer 102 and the second barrier layer 104, which are barrier layers preventing permeation of external foreign materials, may each include a single layer or multiple layers including an inorganic material such as silicon nitride or silicon oxide.

The display layer 200 includes a plurality of pixels. The display layer 200 may include a display element layer 200A that includes display elements arranged in each pixel, and a pixel circuit layer 200B that includes pixel circuits and insulating layers arranged in each pixel. Each of the pixel circuit may include a transistor and a storage capacitor and may be electrically connected to each of the display elements. Each of the display elements may each include an organic light-emitting diode OLED.

The display elements in the display layer 200 may be covered by an encapsulation member such as a thin film encapsulation layer 300 that may include at least one inorganic encapsulation layer and at least one organic encapsulation layer.

When the display panel 10 includes the substrate 100 including a polymer resin and the thin film encapsulation layer 300 including an inorganic encapsulation layer and an organic encapsulation layer, flexibility of the display panel 10 may be enhanced.

The display panel 10 may include the first opening 10H that penetrates (or extends through) the display panel 10. The first opening 10H may be located in the first area OA, and in an embodiment, as shown in FIG. 3A, the first area OA may be a type of opening area (or an opening). In FIG. 3A, the substrate 100 and the thin film encapsulation layer 300 respectively include a first penetration hole 100H and a third penetration hole 300H that correspond to the first opening 10H of the display panel 10. The display layer 200 may also include a second penetration hole 200H corresponding to the first area OA.

Figure 3B:
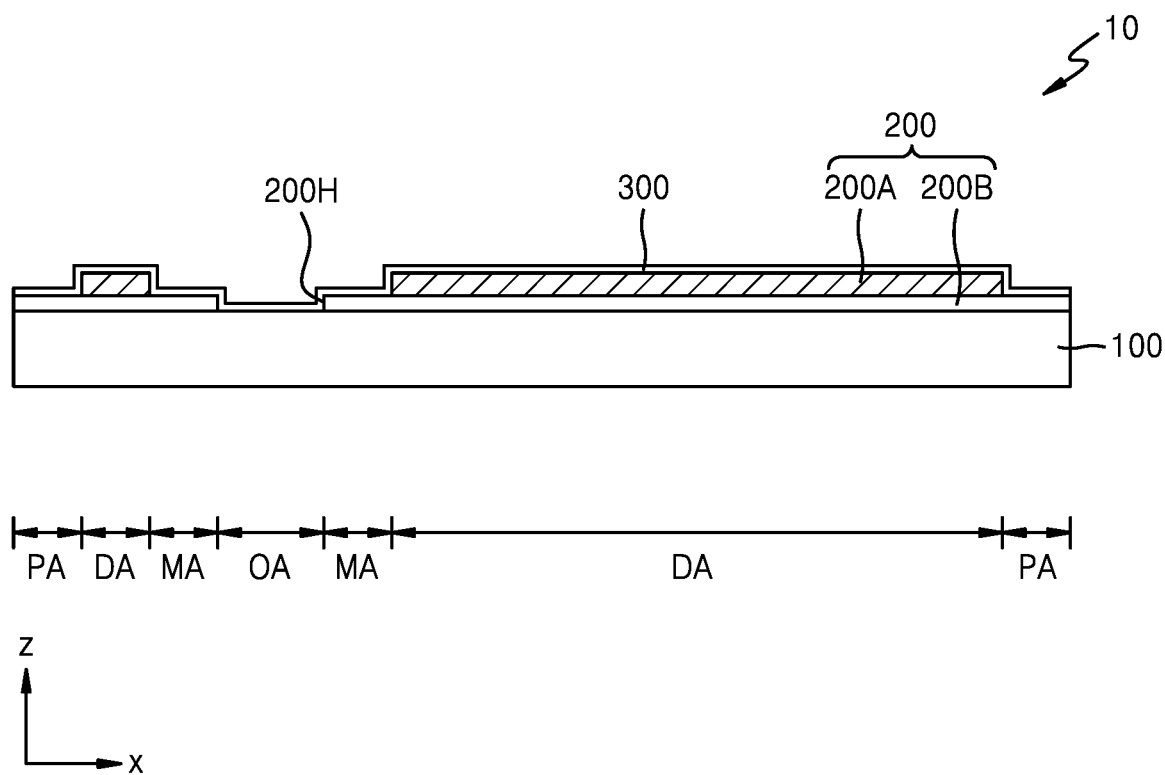

In an embodiment, as shown in FIG. 3B, the substrate 100 may not include a first penetration hole that corresponds to the first area OA. The display layer 200 may include the second penetration hole 200H that corresponds to the first area OA. The thin film encapsulation layer 300 may not include a penetration hole that corresponds to the first area OA. In an embodiment, as shown in FIG. 3C, the display layer 200 may not include the second penetration hole 200H that corresponds to the first area OA, and the display element layer 200A is not located in the first area OA.

Figure 3C:
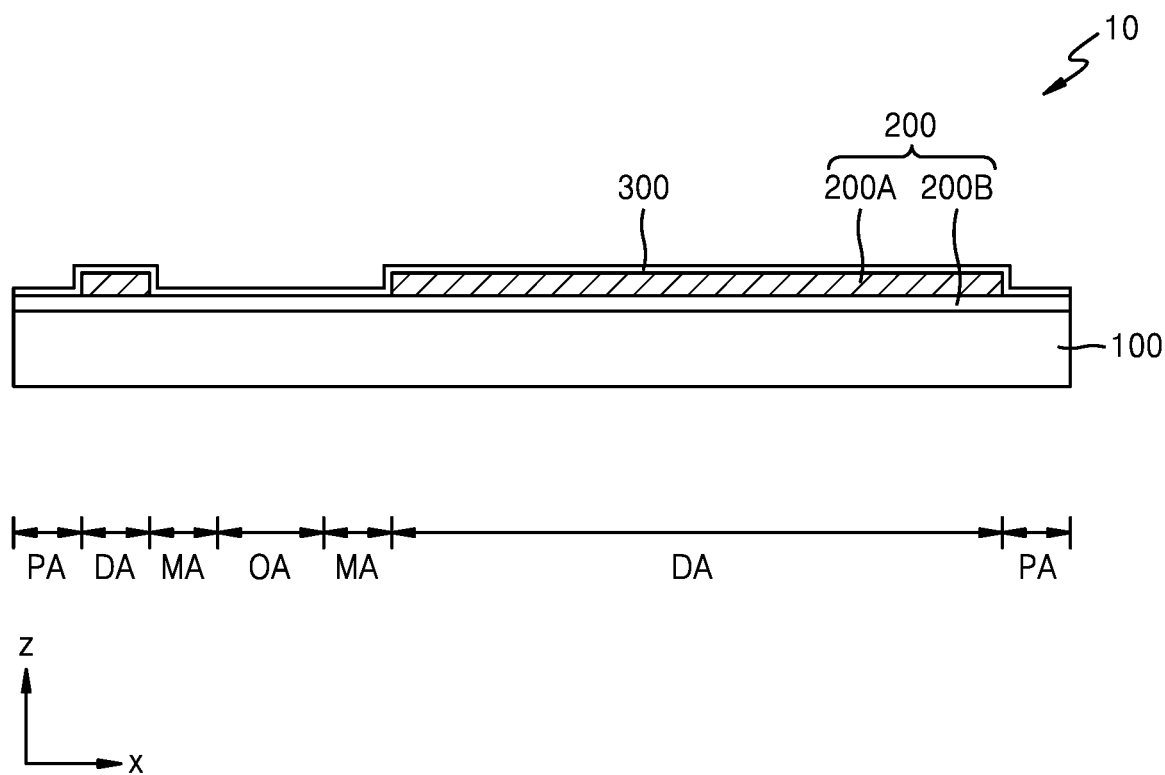
Figure 3D:
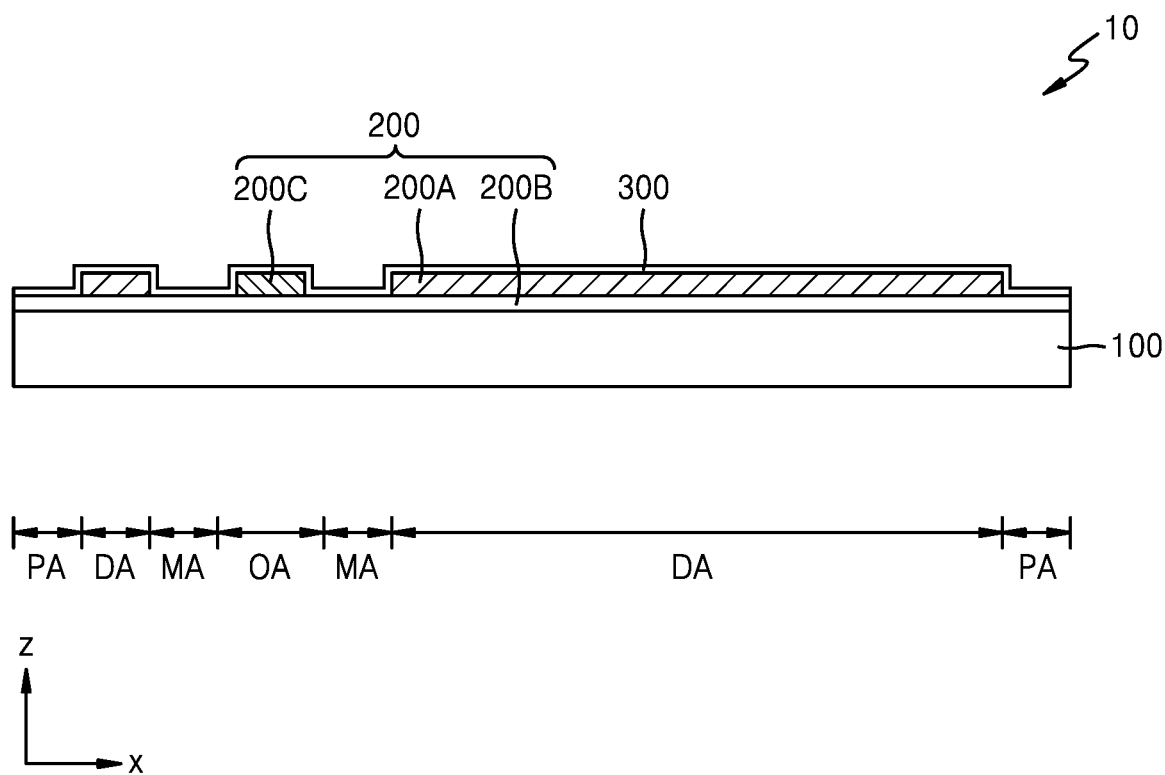

In FIGS. 3A-3C, the display element layer 200A is not located in the first area OA, but the embodiments are not limited thereto. In an embodiment, as shown in FIG. 3D, an auxiliary display element layer 200C may be located in the first area OA. The auxiliary display element layer 200C may include a display element having a different structure and/or operating in a different manner from the display element in the display element layer 200A.

In an embodiment, each pixel in the display element layer 200A may include an active-matrix organic light-emitting diode, and the auxiliary display element layer 200C may include pixels each including a passive-matrix organic light-emitting diode. When the auxiliary display element layer 200C includes a display element of a passive-matrix organic light-emitting diode, elements included in a pixel circuit may not be located under the passive-matrix organic light-emitting diode. For example, in the pixel circuit layer 200B, a portion under the auxiliary display element layer 200C does not include a transistor and a storage capacitor.

In an embodiment, the auxiliary display element layer 200C may include a display element having a like type (e.g., a same type) as the display element layer 200A (e.g., an active-matrix organic light-emitting diode), but a structure of a pixel circuit under the auxiliary display element layer 200C may be different from that of the pixel circuit under the display element layer 200A. For example, the pixel circuit under the auxiliary display element layer 200C (e.g., a pixel circuit having a light-shielding film between a substrate and a transistor) may include a structure that is different from a structure of the pixel circuit under the display element layer 200A. Alternatively, display elements in the auxiliary display element layer 200C may operate in response to a control signal that is different from a signal that is applied to the display elements in the display element layer 200A. A component that does not require a relatively high transmittance (e.g., an infrared ray sensor and the like) may be arranged in the first area OA in which the auxiliary display element layer 200C is arranged. In this case, the first area OA may be understood as a component area and an auxiliary display area.

FIGS. 4A-4D are schematic cross-sectional views each showing a display panel 10' according to another embodiment. Unlike the display panel 10 described with reference to FIGS. 3A-3D including the thin film encapsulation layer 300, the display panel 10' shown in FIGS. 4A-4D may include an encapsulation substrate 300A and a sealant 340.

Figure 4A:
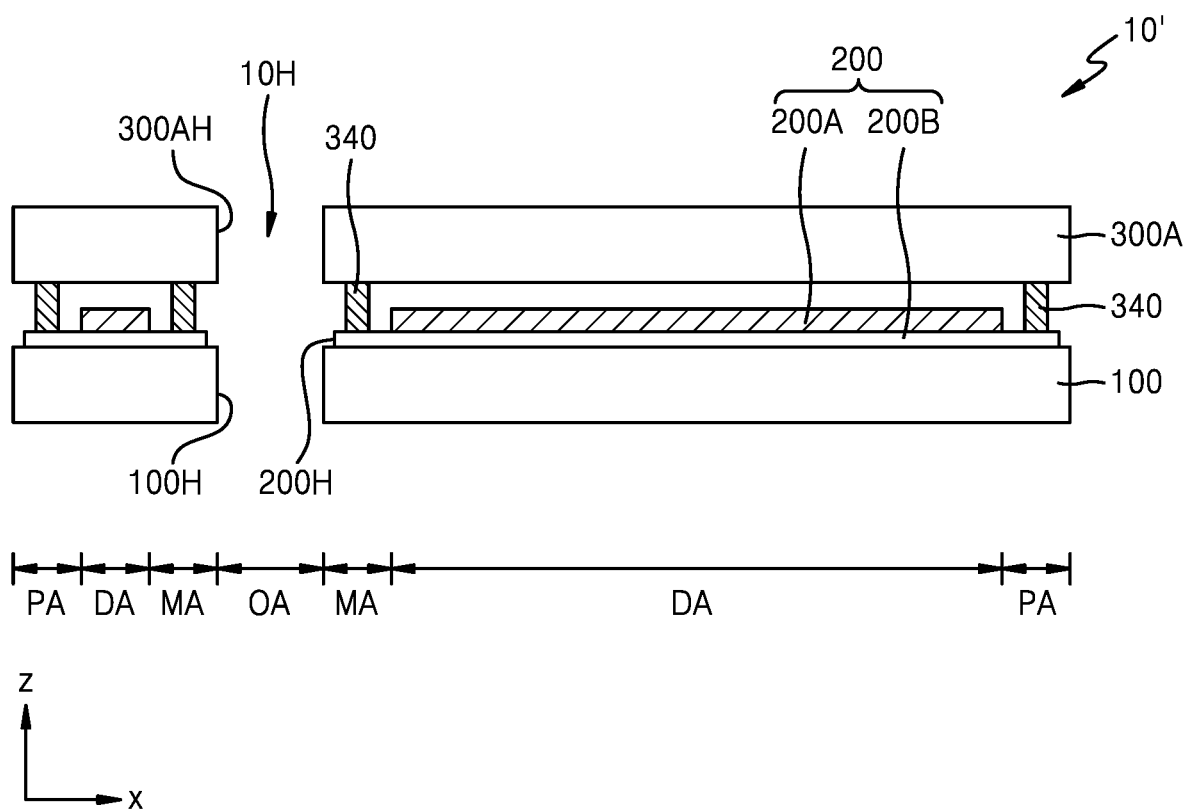
FIGS. 4A-4D are schematic cross-sectional views each showing a display panel according to an embodiment.
Figure 4B:
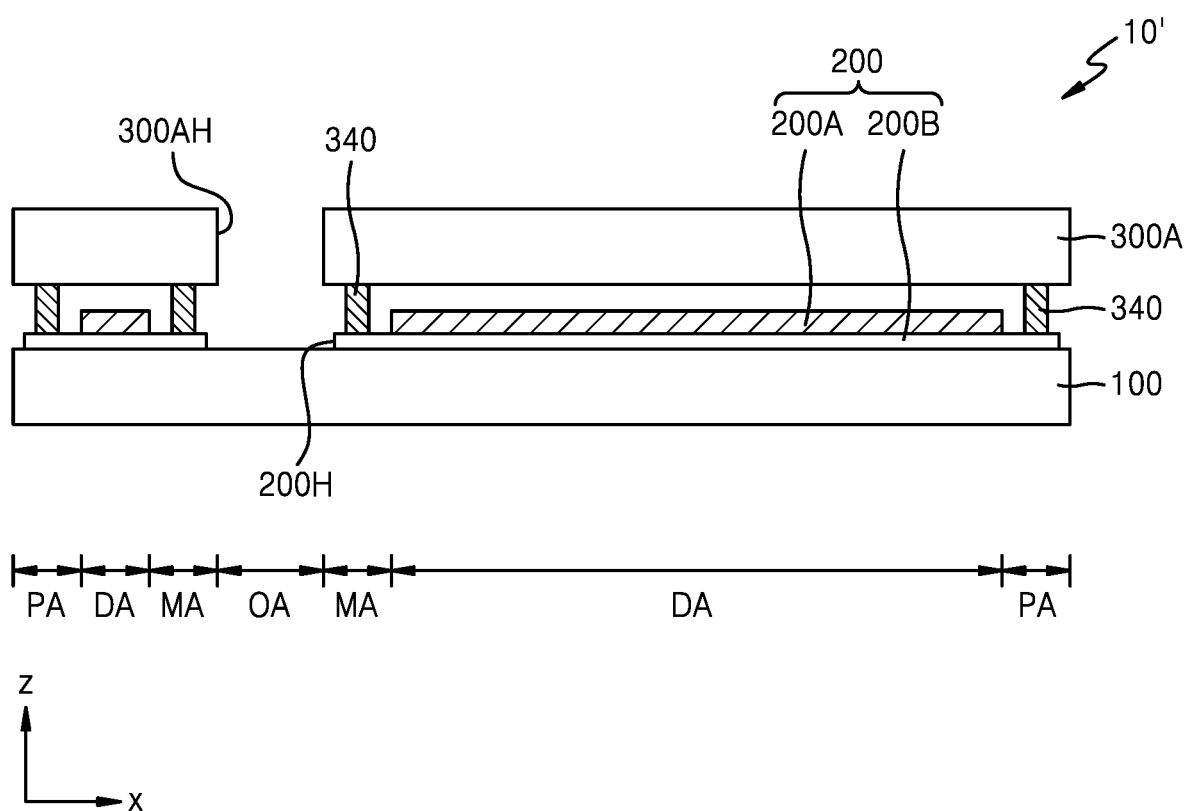
Figure 4C:
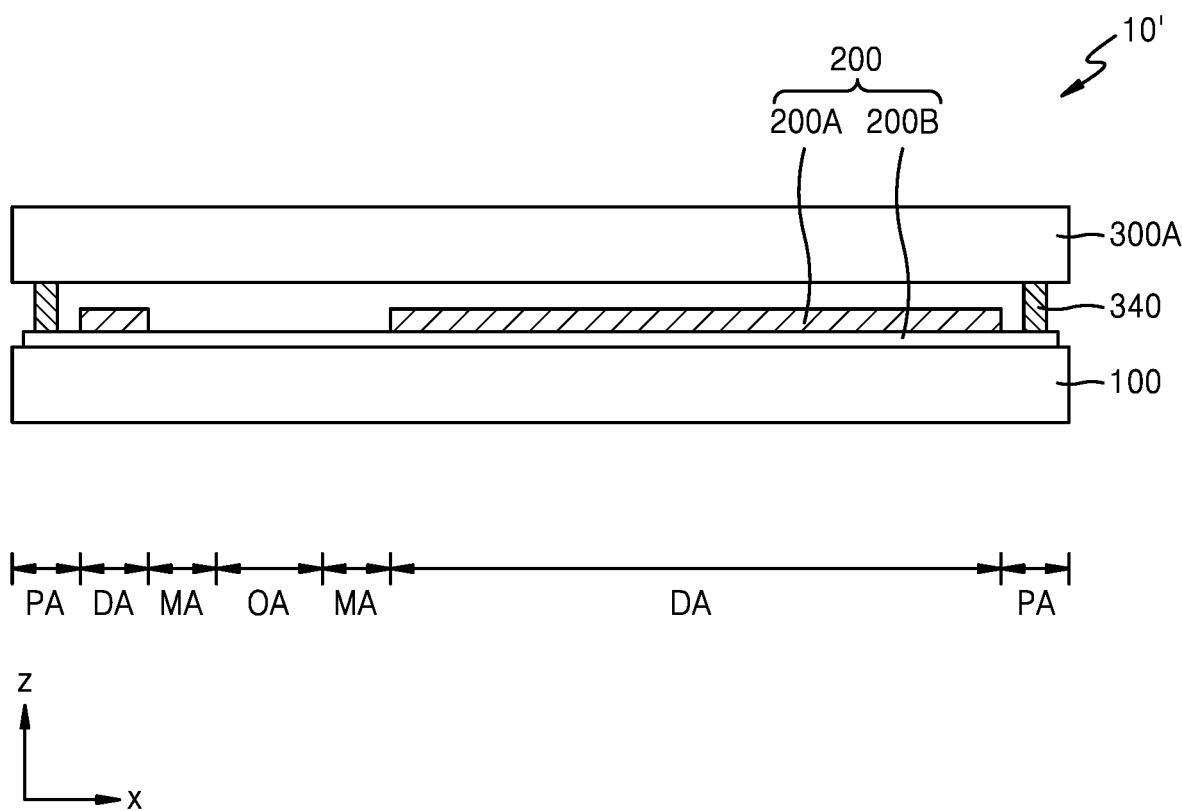
Figure 4D:
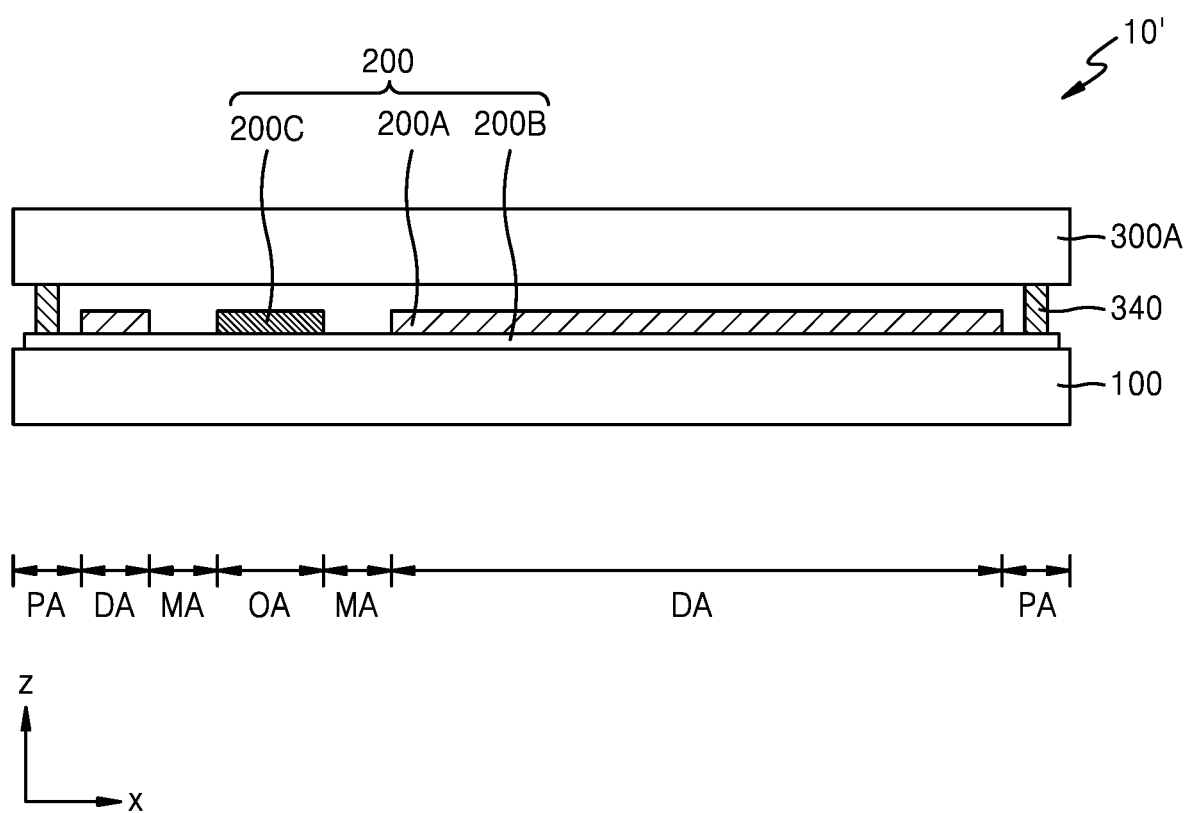

As shown in FIGS. 4A-4C, one or more from among the substrate 100, the display layer 200, and the encapsulation substrate 300A may include the first penetration hole 100H, the second penetration hole 200H, and a third penetration hole 300AH each corresponding to the first area OA. In an embodiment, the display element layer 200A may not be arranged in the first area OA. In an embodiment, the auxiliary display element layer 200C may be arranged in the first area OA as shown in FIG. 4D. The auxiliary display element layer 200C is the same or substantially similar to the auxiliary display element layer described above with reference to FIG. 3D.

Figure 5:
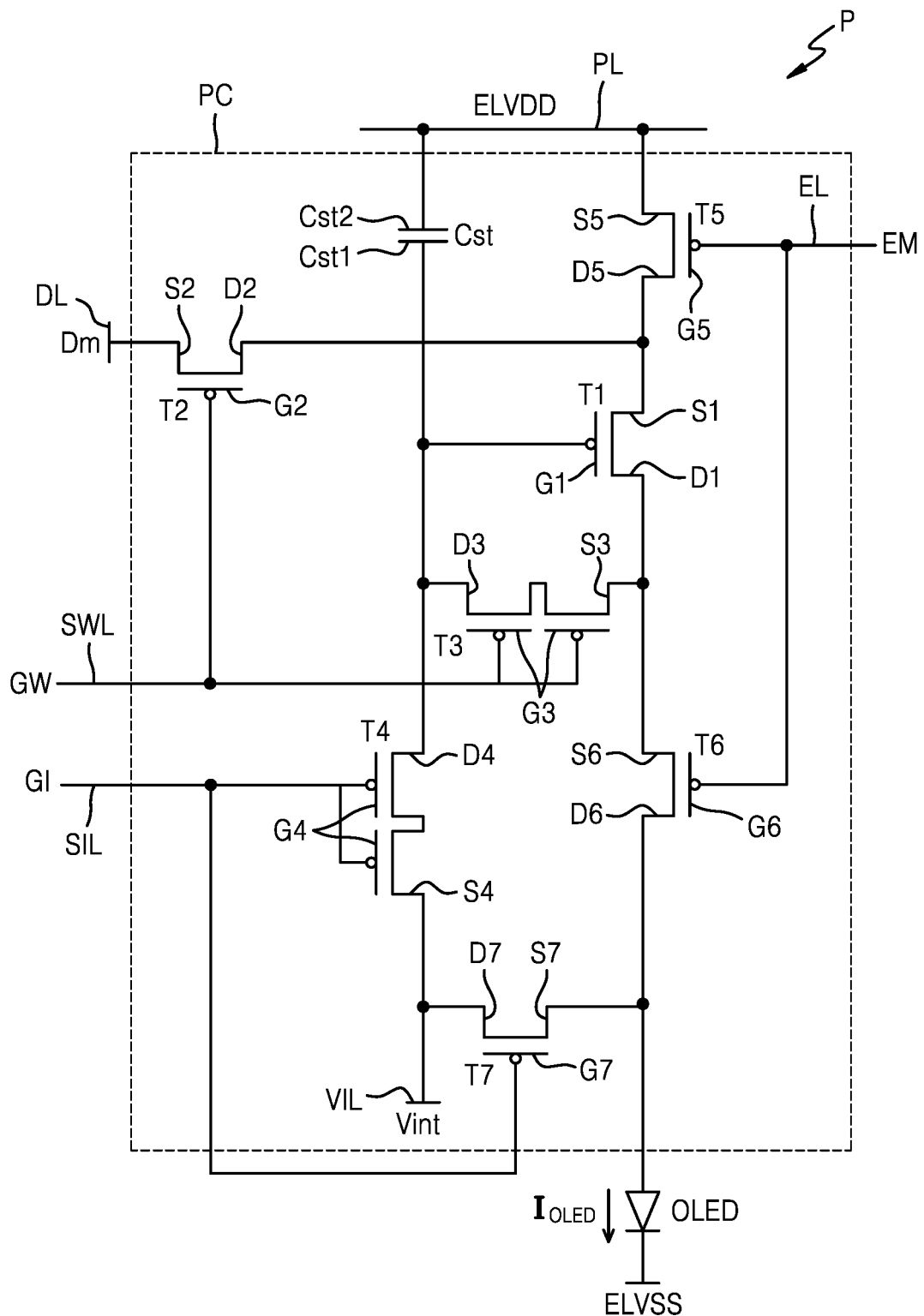
FIG. 5 is an equivalent circuit diagram showing any one pixel in a display panel according to an embodiment.

FIG. 5 is an equivalent circuit diagram showing a pixel P in a display panel according to an embodiment.

Referring to FIG. 5, the pixel P includes a pixel circuit PC and an organic light-emitting diode OLED connected to the pixel circuit PC. The pixel circuit PC may include a plurality of transistors and a storage capacitor. The transistors and the storage capacitor may be connected to signal lines (e.g., a first scan line SWL, a second scan line SIL, an emission control line EL, and a data line DL), an initialized voltage line VIL, and a driving voltage line PL.

FIG. 5 shows an embodiment in which each pixel P is connected to the signal lines (the first scan line SWL, the second scan line SIL, the emission control line EL, and the data line DL), the initialized voltage line VIL, and the driving voltage line PL, but the embodiments are not limited thereto. In an embodiment, at least one of the signal lines (the first scan line SWL, the second scan line SIL, the emission control line EL, and the data line DL), the initialization voltage line VIL, the driving voltage line PL, and/or the like may be shared between neighboring pixels.

The plurality of transistors may include a driving transistor T1, a switching transistor T2, a compensation transistor T3, a first initialization transistor T4, an operation control transistor T5, an emission control transistor T6, and a second initialization transistor T7. Here, all of the plurality of transistors are thin film transistors.

The signal lines include the first scan line SWL that delivers a scan signal GW, the second scan line SIL that delivers a previous scan signal GI to the first initialization transistor T4 and the second initialization transistor T7, the emission control line EL that delivers an emission control signal EM to the operation control transistor T5 and the emission control transistor T6, and the data line DL that crosses the first scan line SWL and delivers a data signal Dm to the first scan line SWL. The driving voltage line PL delivers a driving voltage ELVDD to the driving transistor T1, and the initialization voltage line VIL delivers an initialization voltage Vint that initializes the driving transistor T1 and a pixel electrode.

A driving gate electrode G1 of the driving transistor T1 is connected to a first capacitive plate Cst1 of the storage capacitor Cst; a driving source electrode S1 of the driving transistor T1 is connected to the driving voltage line PL via the operation control transistor T5; and a driving drain electrode D1 of the driving transistor T1 is electrically connected to a pixel electrode of the organic light-emitting device OLED via the emission control transistor T6. The driving transistor T1 receives the data signal Dm in response to a switching operation of the switching transistor T2 and supplies a driving current $I_{OLED}$ to the organic light-emitting diode OLED.

A switching gate electrode G2 of the switching transistor T2 is connected to the first scan line SWL; a switching source electrode S2 of the switching transistor T2 is connected to the data line DL; a switching drain electrode D2 of the switching transistor T2 is connected to the driving source electrode S1 of the driving transistor T1, and is also connected to the driving voltage line PL via the operation control transistor T5. The switching transistor T2 is turned on in response to the scan signal GW delivered through the first scan line SWL and performs a switching operation of delivering the data signal Dm, which is delivered through the data line DL, to the driving source electrode S1 of the driving transistor T1.

A compensation gate electrode G3 of the compensation transistor T3 is connected to the first scan line SWL; a compensation source electrode S3 of the compensation transistor T3 is connected to the driving drain electrode D1 of the driving transistor T1, and at the same time, is also connected to the pixel electrode of the organic light-emitting device OLED via the emission control transistor T6; a compensation drain electrode D3 of the compensation transistor T3 is connected to the first capacitive plate Cst1 of the storage capacitor Cst, the first initialization drain electrode D4 of the first initialization transistor T4, and the driving gate electrode G1 of the driving transistor T1. The compensation transistor T3 is turned on in response to the scan signal GW received through the first scan line SWL to electrically connect the driving gate electrode G1 and the driving drain electrode D1 of the driving transistor T1, thereby having the driving transistor T1 diode-connected.

A first initialization gate electrode G4 of the first initialization transistor T4 is connected to the second scan line SIL; a first initialization source electrode S4 of the first initialization transistor T4 is connected to a second initialization drain electrode D7 of the second initialization transistor T7 and the initialization voltage line VIL; and a first initialization drain electrode of the first initialization transistor T4 is connected to the first capacitive plate Cst1 of the storage capacitor Cst, the compensation drain electrode D3 of the compensation transistor T3, and the driving gate electrode G1 of the driving transistor T1. The first initialization transistor T4 is turned on in response to the previous scan signal GI received through the second scan line SIL and transmits an initialization voltage Vint to the driving gate electrode G1 of the driving transistor T1, thereby performing an initializing operation to initialize a voltage of the driving gate electrode G1 of the driving transistor T1.

An operation control gate electrode G5 of the operation control transistor T5 is connected to the emission control line EL; an operation control source electrode S5 of the operation control transistor T5 is connected to the driving voltage line PL; an operation control drain electrode D5 of the operation control transistor T5 is connected to the driving source electrode S1 of the driving transistor T1 and the switching drain electrode D2 of the switching transistor T2.

An emission control gate electrode G6 of the emission control transistor T6 is connected to the emission control line EL; an emission control source electrode S6 of the emission control transistor T6 is connected to the driving drain electrode of the driving transistor T1 and the compensation source electrode S3 of the compensation transistor T3; and an emission control drain electrode D6 of the emission control transistor T6 is electrically connected to a second initialization source electrode S7 of the second initialization transistor T7 and the pixel electrode of the organic light-emitting diode OLED.

The operation control transistor T5 and the emission control transistor T6 are concurrently (e.g., simultaneously) turned on in response to an emission control signal EM received through the emission control line EL such that the driving voltage ELVDD is delivered to the organic light-emitting device OLED and the driving current $I_{OLED}$ flows through the organic light-emitting device OLED.

A second initialization gate electrode G7 of the second initialization transistor T7 is connected to the second scan line SIL; a second initialization source electrode S7 of the second initialization transistor T7 is connected to the emission control drain electrode D6 of the emission control transistor T6 and the pixel electrode of the organic light-emitting device OLED; and a second initialization drain electrode D7 of the second initialization transistor T7 is connected to the first initialization source electrode S4 of the first initialization transistor T4 and the initialized voltage line VIL. The second initialization transistor T7 is turned on in response to the previous scan signal GI delivered through the second scan line SIL and initializes the pixel electrode of the organic light-emitting diode OLED.

FIG. 5 shows an embodiment in which the first initialization transistor T4 and the second initialization transistor T7 are connected to the second scan line SIL, but the embodiments are not limited thereto. As another embodiment, the first initialization transistor T4 may be connected to the second scan line SIL and be driven in response to the previous scan signal GI, and the second initialization transistor T7 may be connected to a first scan line or a second scan line of a pixel arranged in a previous row or a next row of a relevant pixel P.

A second capacitive plate Cst2 of the storage capacitor Cst is connected to the driving voltage line PL, and an opposite electrode of the organic light-emitting diode OLED is connected to a common voltage ELVSS. Accordingly, the organic light-emitting diode OLED may display an image by receiving the driving current $I_{OLED}$ from the driving transistor T1 and emitting light.

In FIG. 5, the compensation transistor T3 and the first initialization transistor T4 each include a dual gate electrode, but the compensation transistor T3 and the first initialization transistor T4 may each include one gate electrode.

The pixel PC including seven transistors and one storage capacitor is described with reference to FIG. 5, but the embodiments are not limited thereto. In one or more embodiments, the number of transistors may be suitably modified to be, for example, less than or equal to six or equal to or greater than eight according to the design of the pixel circuit PC. In one or more embodiments, the number of storage capacitors may be suitably modified to be, for example, equal to or greater than two according to the design of the pixel circuit PC.

FIG. 5 shows the embodiment in which the first initialization transistor T4 and the second initialization transistor T7 are connected to the second scan line SIL, but the embodiments are not limited thereto. In an embodiment, the first initialization transistor T4 may be connected to the second scan line SIL and driven in response to the previous scan signal GI, and the second initialization transistor T7 may be connected to a first scan line or a second scan line of a pixel that is arranged in a previous row or a next row to a corresponding pixel P.

Figure 6A:
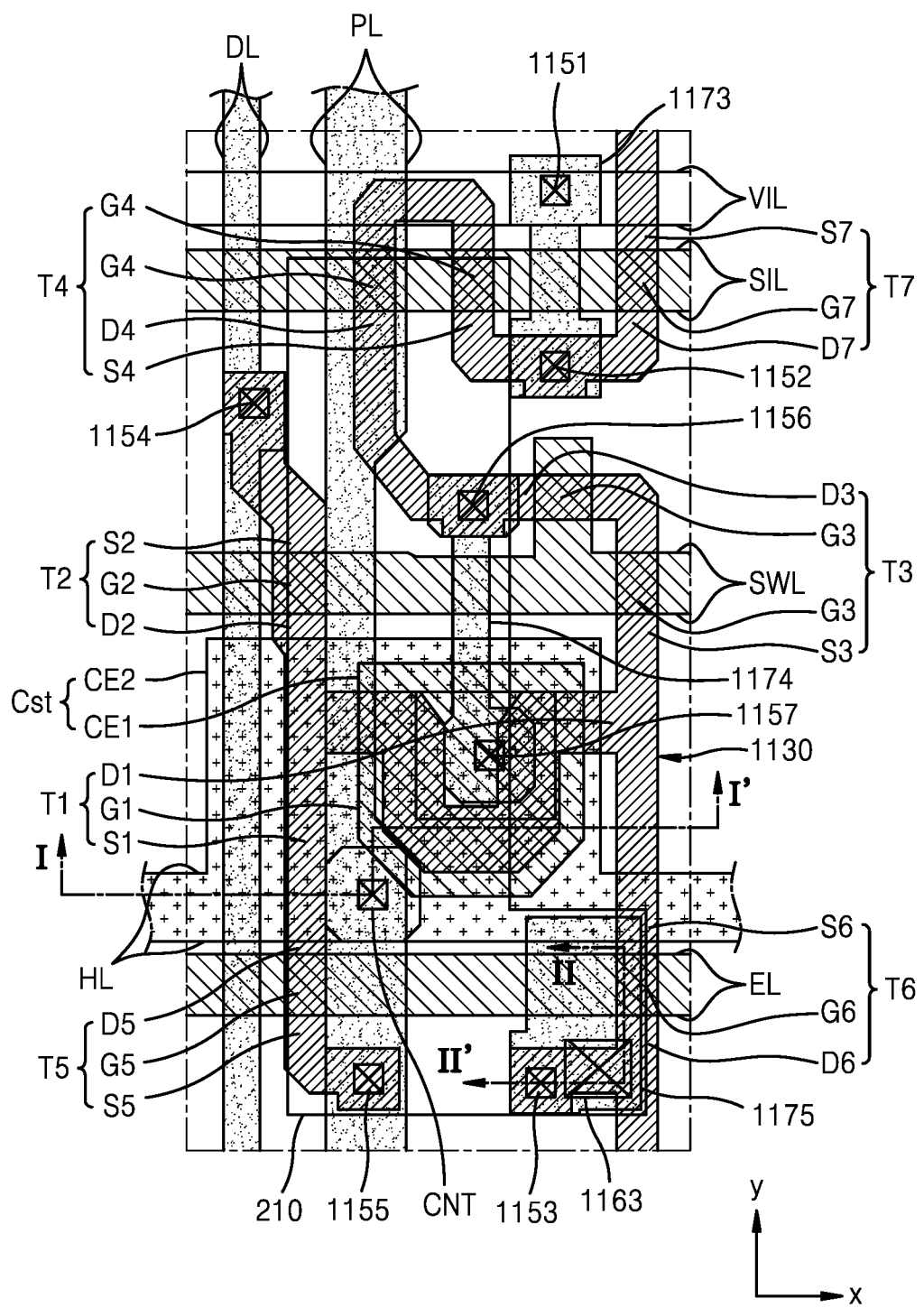
FIG. 6A is a top-plan view of an $n^{th}$ pixel in a display panel according to an embodiment.
Figure 6B:
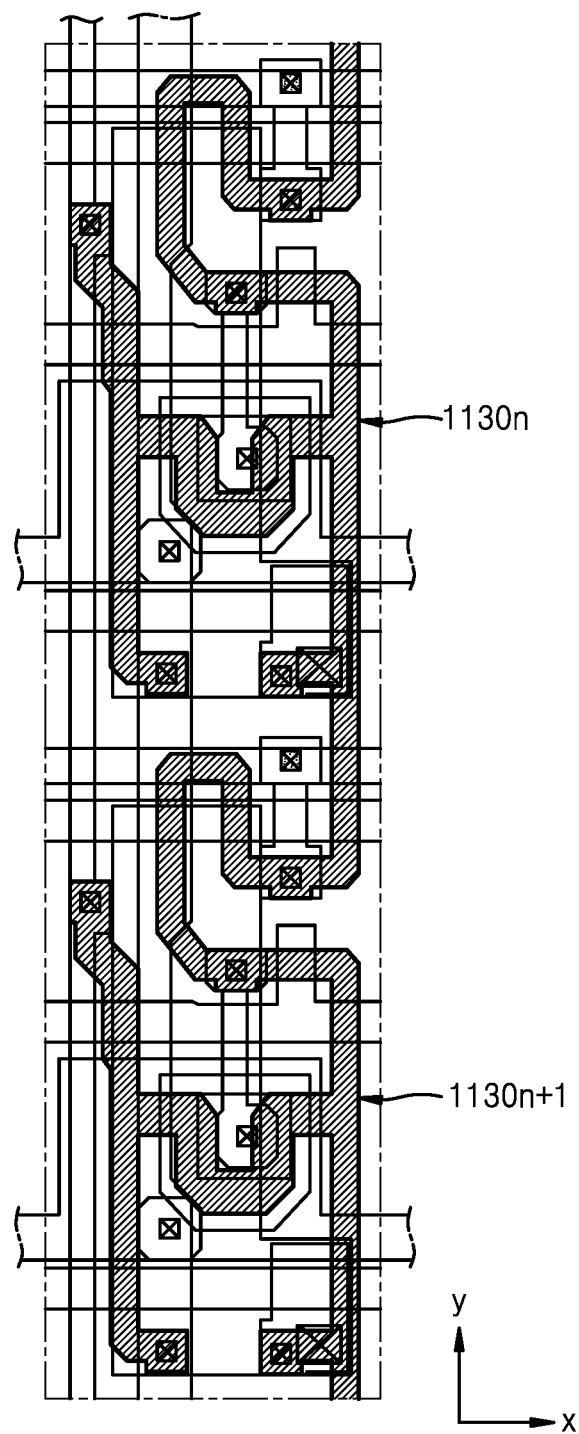
FIG. 6B is an excerpt of a top-plan view of an $n^{th}$ pixel circuit and an $n+1^{th}$ pixel circuit from among pixel circuits in a display panel according to an embodiment.

FIG. 6A is a top-plan view of an $n^{th}$ pixel in a display panel according to an embodiment, and FIG. 6B is an excerpt of a top-plan view of the $n^{th}$ pixel circuit and an $n+1^{th}$ pixel circuit selected from among pixel circuits in a display panel according to an embodiment.

Referring to FIG. 6A, the driving transistor T1, the switching transistor T2, the compensation transistor T3, the first initialization transistor T4, the operation control transistor T5, the emission control transistor T6, and the second initialization transistor T7 are arranged along a semiconductor layer 1130.

Portions of the semiconductor layer 1130 each correspond to a semiconductor layer of each of the driving transistor T1, the switching transistor T2, the compensation transistor T3, the first initialization transistor T4, the operation control transistor T5, the emission control transistor T6, and the second initialization transistor T7. In other words, it may be understood that the semiconductor layers of the driving transistor T1, the switching transistor T2, the compensation transistor T3, the first initialization transistor T4, the operation control transistor T5, the emission control transistor T6, and the second initialization transistor T7 are connected to one another and curved in various suitable shapes.

The semiconductor layer 1130 includes channel regions, a source region, and a drain region. The source region and the drain region are at respective sides of each of the channel regions, wherein the source region and the drain region may be understood as a source electrode and a drain electrode of a relevant transistor. Hereinafter, for convenience, the source region and the drain region are respectively referred to as a source electrode and a drain electrode.

The driving transistor T1 includes the driving gate electrode G1 that overlaps a driving channel region, and a driving source electrode S1 and a driving drain electrode D1 at two sides of the driving channel region. The driving channel region that overlaps the driving gate electrode G1 may form a great channel length in a narrow area by having a bent shape like an omega shape. When the driving channel region is long, a driving range of a gate voltage increases. Therefore, gradation of light emitted from the organic light-emitting diode OLED may be more elaborately controlled, and quality of display may be improved.

The switching transistor T2 includes the switching gate electrode G2 that overlaps a switching channel region, the switching source electrode S2, and the switching drain electrode D2. The switching source electrode S2 and the switching drain electrode D2 are at two sides of the switching channel region. The switching drain electrode D2 may be connected to the driving source electrode S1.

The compensation transistor T3, which may be a dual transistor (e.g., a dual gate transistor), may include the compensation gate electrodes G3 that overlap two compensation channel regions and may also include the compensation source electrode S3 and the compensation drain electrode D3 located at two sides of the compensation channel regions. The compensation transistor T3 may be connected to the driving gate electrode G1 of the driving transistor T1 through a node connection line 1174 which may be described later.

The first initialization transistor T4, which may be a dual transistor (e.g., a dual gate transistor), may include the first initialization gate electrodes G4 that overlap two first initialization channel regions and may also include the first initialization source electrode S4 and the first initialization drain electrode D4 located at two sides of the first initialization channel regions.

The operation control transistor T5 may include the operation control gate electrode G5 overlapping an operation control channel region, and may include the operation control source electrode S5 and the operation control drain electrode D5 located at two sides of the operation control channel region. The operation control drain electrode D5 may be connected to the driving source electrode S1.

The emission control transistor T6 may include the emission control gate electrode G6 that overlaps an emission control channel region, and may include the emission control source electrode S6 and the emission control drain electrode D6 located at two sides of the emission control channel region. The emission control source electrode S6 may be connected to the driving drain electrode D1.

The second initialization transistor T7 may include the second initialization gate electrode G7 that overlaps a second initialization channel region, and may inculde the second initialization source electrode S7 and the second initialization drain electrode D7 located at two sides of the second initialization channel region.

The first scan line SWL, the second scan line SIL, the emission control line EL, and the driving gate electrode G1 may be arranged on the semiconductor layer 1130, with insulating layer(s) therebetween.

The first scan line SWL, the second scan line SIL, the emission control line EL may each extend in a first direction (x-direction). Portions of the first scan line SWL may respectively correspond to the switching gate electrode G2 and the compensation gate electrode G3. Portions of the second scan line SIL may respectively correspond to the first initialization gate electrode G4 and the second initialization gate electrode G7. Portions of the emission control line EL may respectively correspond to the operation control gate electrode G5 and the emission control gate electrode G6.

The driving gate electrode G1, which may be an island electrode, may be connected to the compensation transistor T3 through the node connection line 1174.

The electrode voltage line HL may be arranged above the first scan line SWL, the second scan line SIL, the emission control line, and the driving gate electrode G1 with insulating layer(s) therebetween.

The electrode voltage line HL may extend in the first direction to cross the data line DL and the driving voltage line PL. A portion of the electrode voltage line HL may cover at least a portion of the driving gate electrode G1. For example, the portion of the electrode voltage line HL may overlap the driving gate electrode G1 and may form the storage capacitor Cst together with the driving gate electrode G1. For example, the driving gate electrode G1 may be the first capacitive plate CE1 of the storage capacitor Cst and the portion of the electrode voltage line HL may be the second capacitive plate CE2 of the storage capacitor Cst.

The second capacitive plate CE2 of the storage capacitor Cst is electrically connected to the driving voltage line PL which may be described later. In this regard, the electrode voltage line HL may be in contact with the driving voltage line PL that is arranged above the electrode voltage line HL via the contact hole CNT. Accordingly, the electrode voltage line HL may have a voltage level (e.g., a positive voltage) identical or substantially similar to a voltage level of the driving voltage line PL. The electrode voltage line HL may be understood as a lateral driving voltage line.

The data line DL, the driving voltage line PL, the initialization connection line 1137, and the node connection line 1174 may be arranged above the electrode voltage line HL with an insulating layer(s) therebetween.

The data line DL and the driving voltage line PL may extend in a second direction (y-direction). The data line DL may be in contact with the switching source electrode S2 of the switching transistor T2 via a contact hole 1154. A portion of the data line DL may be understood as the switching source electrode S2.

The driving voltage line PL is in contact with the electrode voltage line HL via the contact hole CNT. The driving voltage line PL may also be connected to the operation control transistor T5 via a contact hole 1155. The driving voltage line PL may be in contact with the operation control drain electrode D5 via the contact hole 1155.

An end portion of the initialization connection line 1173 may be connected to the first initialization T4 and the second initialization transistor T7 via a contact hole 1152, and another end portion of the initialization connection line 1173 may be connected to an initialization voltage line VIL that may be described later, via a contact hole 1151.

An end portion of the node connection line 1174 may be connected to the compensation drain electrode D3 via a contact hole 1156, and another end portion of the node connection line 1174 may be in contact with the driving gate electrode G1 via a contact hole 1157.

The initialization voltage line VIL may be arranged on the data line DL, the driving voltage line PL, the initialization connection line 1173, and the node connection line 1147 with insulating layer(s) therebetween.

The initialization voltage line VIL may extend in the first direction (the x-direction). The initialization voltage line VIL may be connected to the first initialization transistor T4 and the second initialization transistor T7 through the initialization connection line 1173.

The initialization voltage line VIL may be arranged on a same layer as the pixel electrode 210 of the organic light-emitting diode OLED and may include a same material as the pixel electrode 210 of the organic light-emitting diode OLED. The pixel electrode 210 may be connected to the emission control transistor T6. The pixel electrode 210 may be in contact with a contact metal 1175 via a contact hole 1163 and the contact metal 1175 may be in contact with the emission control drain electrode D6 via the contact hole 1153. FIG. 6A shows that the initialization voltage line VIL is arranged on the same layer as that of the pixel electrode 210 (see FIG. 7). However, in another embodiment, the initialization voltage line VIL may be arranged on a same layer as that of the electrode voltage line HL.

In FIG. 6A, the second initialization transistor T7 is electrically connected to the second scan line SIL, however, as another embodiment, the second initialization transistor T7 may be connected to a first scan line or a second scan line included in a pixel circuit of an n−1 pixel or may be connected to a first scan line or a second scan line included in pixel circuit of an n+1 pixel.

Referring to FIG. 6B, a semiconductor layer $1130n$ in the $n^{th}$ pixel may be connected to a semiconductor layer $1130n+1$ in the $n+1^{th}$ pixel. In this case, neighboring pixel circuits, for example, a pixel circuit of the $n^{th}$ pixel and a pixel circuit of the $n+1^{th}$ pixel may share one or more signal lines, and pixel circuits may be effectively arranged in an area of a small extent (e.g., a relatively small area).

Figure 7:
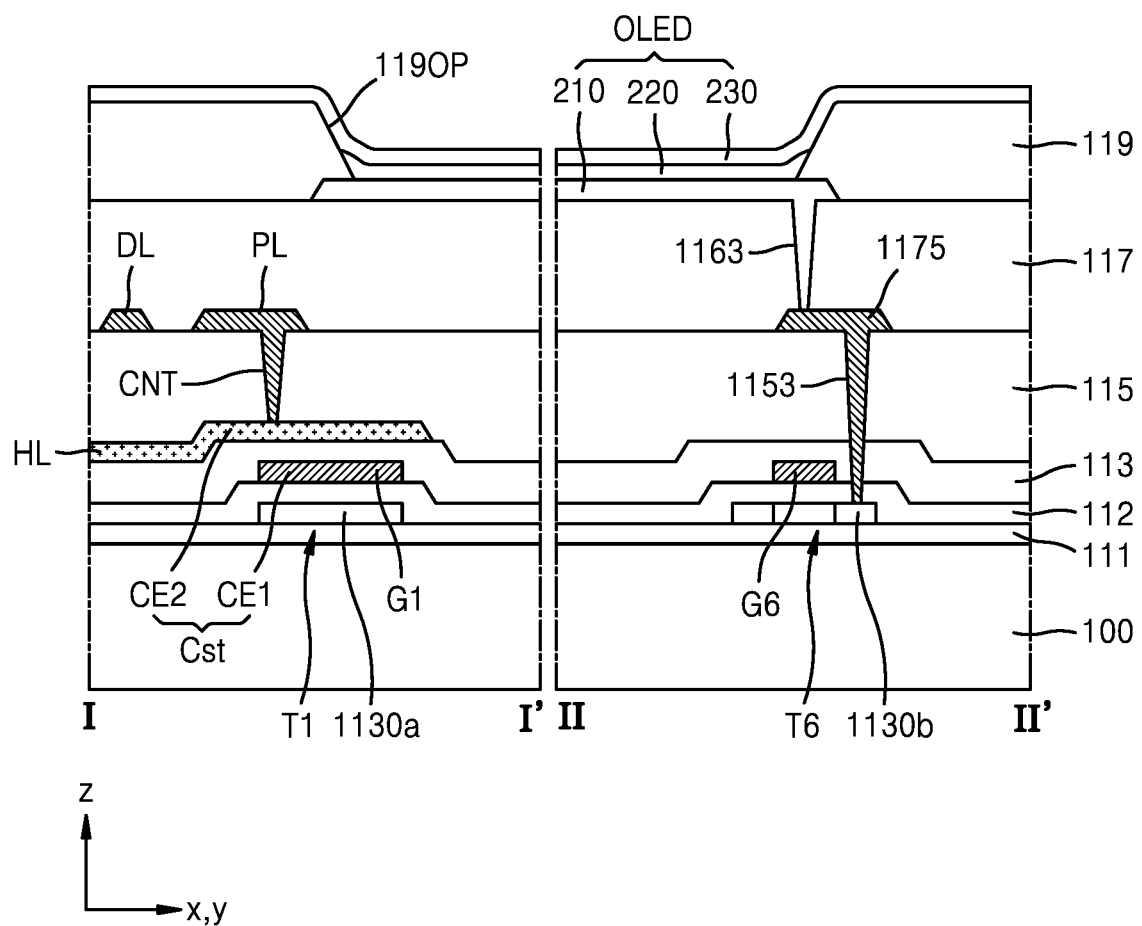
FIG. 7 is a cross-sectional view of any one pixel according to an embodiment.

FIG. 7 is a cross-sectional view of a pixel according to an embodiment; FIG. 7 is a cross-sectional view of the top-plan view of the $n^{th}$ pixel, taken along lines I-I' and II-II' shown in FIG. 6A.

As described above, the substrate 100 may include glass and/or a polymer resin. A buffer layer 111, which is located on the substrate 100, may reduce or prevent permeation of a foreign material, humidity, or external air from the lower portion of the substrate 100 and provide a planarized surface on the substrate 100. The buffer layer 111 may include an inorganic material such as an oxide or a nitride, an organic material, or an organic-inorganic complex material, and may include a single layer or multiple layers of the inorganic material and/or the organic material.

The semiconductor layers 1130a and 1130b may include polysilicon. In an embodiment, the semiconductor layers 1130a and 1130b may include amorphous silicon, an oxide semiconductor, or an organic semiconductor. The semiconductor layers 1130a and 1130b shown in FIG. 7 are portions of the semiconductor layer 1130 described with reference to FIG. 6A.

The driving gate electrode G1 and the emission control gate electrode G6 are respectively arranged on semiconductor layers 1130a and 1130b with a first gate insulating layer 112 therebetween. Each of the driving gate electrode G1 and the emission control gate electrode G6 may include molybdenum (Mo), aluminum (Al), copper (Cu), and titanium (Ti) and may include a single layer or multiple layers. For example, each of the driving gate electrode G1 and the emission control gate electrode G6 may include a single layer of Mo. The first scan line SWL (see FIG. 6A), the second scan line SIL, and the emission control line EL may be formed at a same layer as that of the driving gate electrode G1 and the emission control gate electrode G6. That is, the driving gate electrode G1, the emission control gate electrode G6, the first scan line SWL (see FIG. 6A), the second scan line SIL, and the emission control line EL may be arranged on the first gate insulating layer 112.

The first gate insulating layer 112 may include silicon oxide, silicon nitride, silicon oxynitride, aluminum oxide, titanium oxide, tantalum oxide, hafnium oxide, or zinc oxide.

A second gate insulating layer 113 may be provided to cover the driving gate electrode G1 and the emission control gate electrode G6. The second gate insulating layer 113 may include silicon oxide, silicon nitride, silicon oxynitride, aluminum oxide, titanium oxide, tantalum oxide, hafnium oxide, or zinc oxide.

The first capacitive plate CE1 of the storage capacitor Cst may be formed in one body with the driving gate electrode G1 of the driving transistor T1. That is, the driving gate electrode G1 of the driving transistor T1 may function as the first capacitive plate CE1 of the storage capacitor Cst.

The second capacitive plate CE2 of the storage capacitor Cst overlaps the first capacitive plate CE1 with the second gate insulating layer 113 therebetween. In this case, the second gate insulating layer 113 may function as a dielectric layer of the storage capacitor Cst. The second capacitive plate CE2 may include a conductive material including Mo, Al, Cu, and Ti and may include a single layer or multiple layers including the above-mentioned materials. For example, the second capacitive plate CE2 may include a single layer of Mo or multiple layers such as Mo/Al/Mo.

Although the storage capacitor Cst is shown as overlapping the driving transistor T1, the embodiments not limited thereto. An arrangement of the storage capacitor Cst may be variously changed, for example, in one or more embodiments, the storage capacitor Cst may be arranged not to overlap the driving transistor T1.

The second capacitive plate CE2 may function as the electrode voltage line HL. For example, a portion of the electrode voltage line EL may be the second capacitive plate CE2 of the storage capacitor Cst.

An interlayer insulating layer 115 may be provided to cover the second capacitive plate CE2. The interlayer insulating layer 115 may include silicon oxide, silicon nitride, silicon oxynitride, aluminum oxide, titanium oxide, tantalum oxide, hafnium oxide, or zinc oxide.

The data line DL, the driving voltage line PL, and the contact metal 1175 may be arranged on the interlayer insulating layer 115. The data line DL, the driving voltage line PL, and the contact metal 1175 may each include a conductive material including Mo, Al, Cu, and Ti, and may include multiple layers or a single layer including the above-mentioned materials. For example, the data line DL, the driving voltage line PL, and the contact metal 1175 may include a multiple layer structure such as Ti/Al/Ti.

The data line DL and the driving voltage line PL may deliver a signal or a voltage to each pixel. Specific resistances (e.g., specific electrical resistances) of the data line DL and the driving voltage line PL may be less than a specific resistance of the second capacitive plate CE2 or a specific resistance of the electrode voltage line HL. In one or more embodiments, the specific resistances of the data line DL and the driving voltage line PL may be about a tenth (about one tenth) of the specific resistance of the second capacitive plate CE2 or the specific resistance of the electrode voltage line HL.

The second capacitive plate CE2 of the storage capacitor Cst may be in contact with the driving voltage line PL via the contact hole CNT that is defined in the interlayer insulating layer 115. This may indicate that the electrode voltage line HL is in contact with the driving voltage line PL via the contact hole CNT. Accordingly, the electrode voltage line HL may have a voltage level (e.g., a positive voltage) that is identical to or substantially similar to that of the driving voltage line PL.

The contact metal 1175 is in contact with the semiconductor layer 1130b of the emission control transistor T6 via the contact hole 1153 that penetrates (or extends through) the interlayer insulating layer 115, the second gate insulating layer 113, and the first gate insulating layer 112. The emission control transistor T6 may be electrically connected to the pixel electrode 210 of the organic light-emitting diode OLED via the contact metal 1175.

A planarization layer 117 may be located on the data line DL, the driving voltage line PL, and the contact metal 1175, and the organic light-emitting diode OLED may be located on the planarization layer 117.

The planarization layer 117 may have a planarized upper surface such that the pixel electrode 210 is formed in a planarized shape. The planarization layer 117 may include a single layer or multiple layers including a film formed of an organic material. The planarization layer 117 may include a general commercial polymer like benzocyclobutene (BCB), polyimide, hexamethyldisiloxane (HMDSO), polymethylmethacrylate (PMMA), and/or polystyrene (PS), a general commercial polymer having a phenolic group, an acrylic polymer, an imide polymer, an arylether polymer, an amide polymer, a flourinated polymer, a p-xylene polymer, a vinyl alcohol polymer, and/or a blend thereof. In an embodiment, the planarization layer 117 may include an inorganic material such as silicon nitride and/or silicon oxide, and when the planarization layer 117 includes an inorganic material, a chemical polarization polishing operation may be performed as needed. In an embodiment, the planarization layer 117 may include both an organic material and an inorganic material.

A contact hole 1163 that exposes the contact metal 1175 is in the planarization layer 117, and the pixel electrode 210 is in contact with the contact metal 1175 via the contact hole 1163.

The pixel electrode 210 may be a (semi) transmissive electrode or a reflective electrode. In one or more embodiments, the pixel electrode 210 may include a reflective film that includes silver (Ag), magnesium (Mg), aluminum (Al), platinum (Pt), palladium (Pd), gold (Au), nickel (Ni), neodymium (Nd), iridium (Ir), chromium (Cr), and/or a combination thereof, and may also include a transparent or translucent electrode layer that is formed on the reflecting film. The transparent or translucent electrode layer may include at least one from among indium tin oxide (ITO), indium zinc oxide (IZO), zinc oxide (ZnO), indium oxide ($In_2O_3$), indium gallium oxide (IGO), and aluminum zinc oxide (AZO). In one or more embodiments, the pixel electrode 210 may include a stack structure (e.g., ITO/Ag/ITO).

A pixel defining layer 119 may be arranged on the planarization layer 117, and the pixel defining layer 119 may define an emission area of a pixel by having an opening 1190P that exposes a center portion of the pixel electrode 210. In addition, the pixel defining layer 119 may prevent or may substantially prevent arcs and the like at one or more edges of the pixel electrode 210 by increasing a distance between the edge of the pixel electrode 310 and an opposite electrode 230 at an upper portion of the pixel electrode 210. The pixel defining layer 119 may include an organic insulating material such as polyimide, polyamide, an acryl resin, BCB, HMDSO, and a phenolic resin, and may be formed using a spin coating method and the like.

An intermediate layer 220 of the organic light-emitting diode OLED may include an organic emission layer. The organic emission layer may include an organic material including a fluorescent material or a phosphorescent material that emits red light, green light, blue light, or white light. The organic emission layer may include a low molecular weight organic material or a high molecular weight organic material. Function layers such as a hole transport layer (HTL), a hole injection layer (HIL), an electron transport layer (ETL), and an electron injection layer (EIL) may be alternatively and additionally arranged under and above the organic emission layer. The intermediate layer 220 may be arranged to correspond to each of the plurality of pixel electrodes 210. However, the intermediate layer 220 is not limited thereto. The intermediate layer 220 may be suitably modified, for example, in one or more embodiments the intermediate layer 220 includes a layer that is formed in one body across the plurality of pixel electrodes 210.

The opposite electrode 230 may be a light-transmissive electrode or a reflective electrode. In one or more embodiments, the opposite electrode 230 may include a transparent or translucent electrode and may include a metal thin film that includes lithium (Li), calcium (Ca), lithium fluoride (LiF)/Ca, LiF/Al, aluminum (Al), silver (Ag), magnesium (Mg), and/or a combination thereof and has a small work function. A transparent conductive oxide (TCO) layer including ITO, IZO, ZnO, or $In_2O_3$ and the like may be further arranged on the metal thin film. The opposite electrode 230 may be arranged across the display area DA and the peripheral area PA and may be arranged on the intermediate layer 220 and the pixel defining layer 119. The opposite electrode 230 may be formed as a single body with respect to a plurality of organic light-emitting diodes OLED to correspond to the plurality of pixel electrodes 210.

When the pixel electrode 210 is a reflective electrode and the opposite electrode 230 is a transmissive electrode, light emitted from the intermediate layer 220 is emitted toward the opposite electrode 230, and thus, the display apparatus may be a top emission type. When the pixel electrode 210 includes a transparent or translucent electrode and the opposite electrode 230 includes a reflective electrode, the light emitted from the intermediate layer 220 is emitted toward the substrate 100, and thus, the display apparatus may be a bottom emission type. However, the embodiments are not limited thereto. The display apparatus in the embodiment may be a dual emission type which emits light in two directions (e.g., towards the top and towards the bottom).

Figure 8:
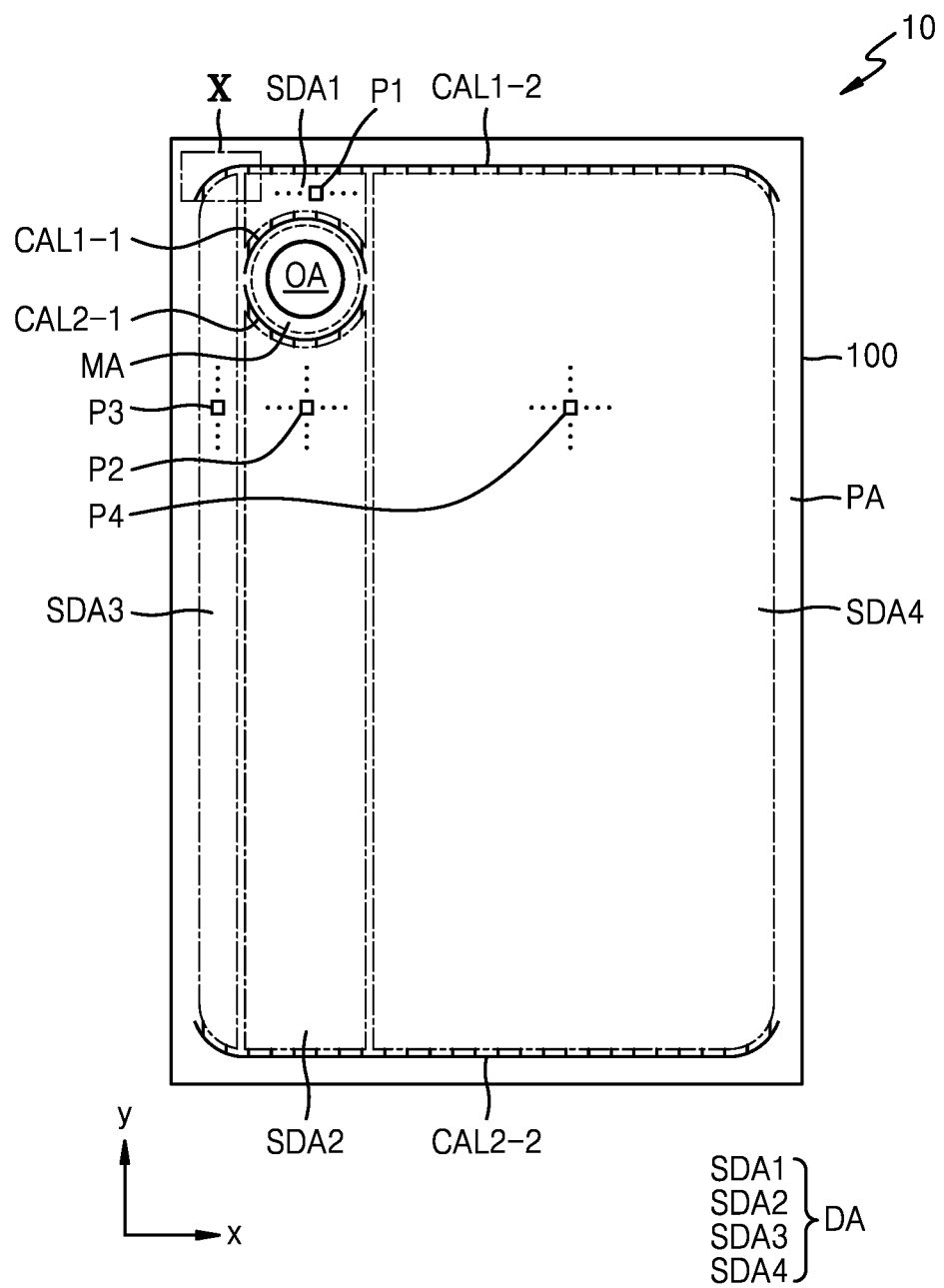
FIG. 8 is a schematic top-plan view showing a display panel according to an embodiment.
Figure 9:
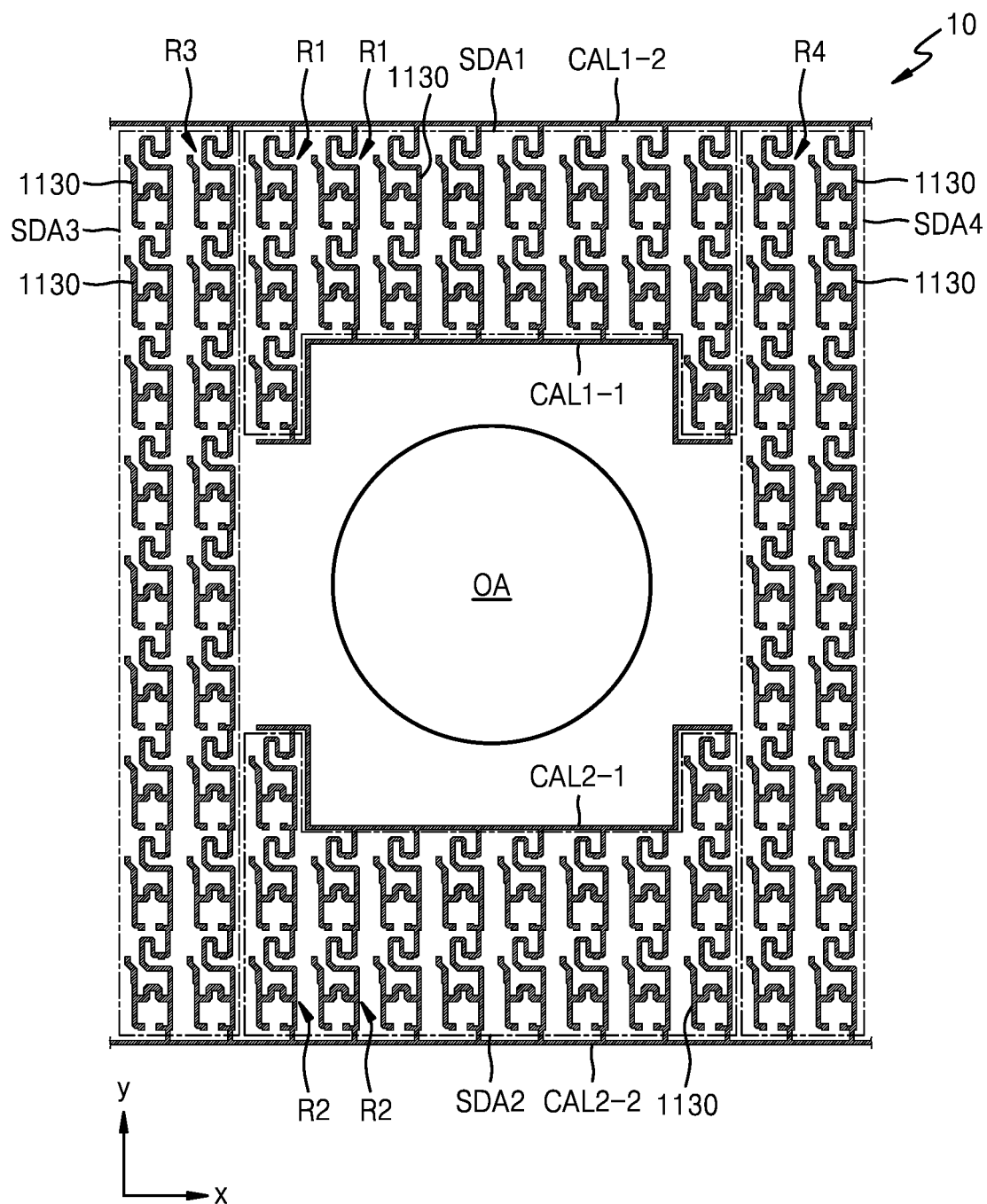
FIG. 9 is an excerpt of a top-plan view of semiconductor layers included in each of pixels arranged near a first area in a display panel according to an embodiment.

FIG. 8 is a schematic top-plan view of the display panel 10 according to an embodiment, and FIG. 9 is an excerpt of a top-plan view of selected semiconductor layers including the pixels arranged around the first area in the display panel 10 according to an embodiment.

Referring to FIG. 8, the display panel 10 may include the first area OA, the display area DA that surrounds the first area OA, the middle area MA that is located between the first area OA and the display area DA, and the peripheral area PA that surrounds the display area DA. FIG. 8 may be understood as illustrating the substrate 100 in the display panel 10. For example, it may be understood that the substrate 100 of the display panel 10 includes the first area OA, the display area DA, the middle area MA, and the peripheral area PA.

The display area DA is an area in which a plurality of pixels are arranged. Hereinafter, for convenience of explanation, the display area DA is described as including a plurality of sub-display areas. For example, in the top-plan view of FIG. 8, portions of the display area DA located above, under, left, and right with respect to the first area OA are respectively referred to as a first sub-display area SDA1, a second sub-display area SDA2, a third sub-display area SDA3, and a fourth sub-display area SDA4.

The plurality of pixels may include first pixels P1 arranged in the first sub-display area SDA1, second pixels P2 arranged in the second sub-display area SDA, third pixels P3 arranged in the third sub-display area SDA3, and fourth pixels P4 arranged in the fourth sub-display area SDA4. A first group of the first pixels P1 may be arranged in the first sub-display area SDA1; a second group of the second pixels P2 may be arranged in the second sub-display area SDA2; a third group of the third pixels P3 may be arranged in the third sub-display area SDA3; and a fourth group of the fourth pixels P4 may be arranged in the fourth sub-display area SDA4.

The first pixels P1, the second pixels P2, the third pixels P3, and the fourth pixels P4 may each include the pixel circuit that is described above with reference to FIG. 6A, and each pixel may include the semiconductor layer 1130 as shown in FIG. 9. Around the first area OA, the semiconductor layers 1130 may have a stepwise configuration. The semiconductor layers 1130 included in neighboring pixels may be connected to one another in a first direction, that is, the y-direction, as shown in FIG. 9.

Referring to FIGS. 8 and 9, each of the first pixels P1 in the first sub-display area SDA1 includes the semiconductor layer 1130, and as shown in FIG. 9, the semiconductor layers 1130 included in the first pixels P1 may be connected to one another in the y-direction and form a plurality of first rows R1. That is, each of the first rows R1 includes the plurality of semiconductor layers 1130 connected to one another in the y-direction.

Similarly, each of the second pixels P2 in the second sub-display area SDA2 includes the semiconductor layer 1130, and as shown in FIG. 9, the semiconductor layers 1130 in the second pixels P2 may be connected to one another in the y-direction and form a plurality of second rows R2. Each of the second rows R2 includes the plurality of semiconductor layers 1130 connected to one another in the y-direction.

The third pixels P3 and the fourth pixels P4 respectively arranged in the third sub-display area SDA3 and the fourth sub-display area SDA4 also each include a semiconductor layer 1130. The semiconductor layers 1130 in the third pixels P3 may be connected to one another in the y-direction and form a plurality of third rows R3, and the semiconductor layers 1130 in the fourth pixels P4 may be connected to one another in the y-direction and form a plurality of fourth rows R4. The third rows R3 and the fourth rows R4 respectively include the plurality of semiconductor layers 1130 connected to one another in the y-direction.

That is, the semiconductor layers 1130 located in the display area DA extend in the y-direction and form a plurality of rows (e.g., the first rows R1, the second rows R2, the third rows R3, and the fourth rows R4), wherein the first rows R1 and the second rows R2 are apart (or spaced apart) from each other and the first area OA may be therebetween. The third rows R3 and the fourth rows R4 may respectively extend (e.g., extend continuously) in the y-direction across the display area DA as shown in FIG. 9. As the first area OA is provided between the first rows R1 and the second rows R2, a length (e.g., a length in the y-direction) of each of the first rows R1 and the second rows R2 may be less than a length of the third row R3 or the fourth row R4. A total extent or area of the first rows R1 may be less than that of the third row R3 or the fourth row R4. Likewise, A total extent or area of the second rows R2 may be less than that of the third row R3 or the fourth row R4

According to the structural differences described above, a load deviation is caused in each portion of the display area DA, and non-uniformity in luminance may be caused in each portion of the display area DA due to the load deviation. For example, the non-uniformity in luminance may be prominent in a portion in which rows of a relatively short semiconductor layer are arranged (e.g., the first sub-display area SDA1 shown in FIG. 8). However, the display panel 10 according to the embodiment(s) may include a connection line that connects rows of a semiconductor layer arranged around the first area OA, thereby reducing the load deviation and preventing or reducing the non-uniformity in luminance.

In an embodiment, the first rows R1 respectively extending in the first direction (e.g., the y-direction) may be connected to the first connection line that extends in the second direction (e.g., the x-direction) that intersects with or crosses a direction in which the first rows R1 extend. In this regard, FIG. 9 shows an embodiment in which the first connection line that connects the first rows R1 to one another includes a first-first connection line CAL1-1 and a first-second connection line CAL1-2. In one or more embodiments, the first connection line CAL1-1 and the first-second connection line CAL1-2 may include a same material as that of the semiconductor layer 1130 and may be concurrently (e.g., simultaneously) formed with the semiconductor layer 1130 during a process of forming the semiconductor layer 1130. The first connection line may be integrally formed with the first rows R1.

As another embodiment, the second rows R2 respectively extending in the first direction (e.g., the y-direction) may be connected to a second connection line that extends in a direction (e.g., the x-direction) that crosses a direction in which the second rows R2 extend. In this regard, FIG. 9 shows that the second connection line, which connects the second rows R2 to one another, includes a second-first connection line CAL2-1 and a second-second connection line CAL2-2. In one or more embodiments, the second-first connection line CAL2-1 and the second-second connection line CAL2-2 may include a same material as that of the semiconductor layer 1130 and may be concurrently (e.g., simultaneously) formed with the semiconductor layer 1130 during the process of forming the semiconductor layer 1130. The second connection line may be integrally formed with the second rows R2.

While the display panel 10 includes both the first connection line and the second connection line in FIGS. 8 and 9, in one or more embodiments, the first connection line or the second connection line may be omitted.

The first connection line may be connected to end portions of the first rows R1. For example, the first rows R1 may respectively include first end portions and second end portions that are opposite to the first end portions. The first-first connection line CAL1-1 may be connected to each of the first end portions of the first rows R1, and the first-second connection line CAL1-2 may be connected to each of the second end portions of the first rows R1. The first-first connection line CAL1-1 may be located relatively adjacent to the first area OA, and the first-second connection line CAL1-2 may be located to be relatively away from (e.g., not directly adjacent to) the first area OA.

The first-first connection line CAL1-1 and the first-second connection line CAL1-2 are respectively connected to the first rows R1, and the first-second connection line CAL1-2 may extend further in the second direction (e.g., the x-direction) to be connected to rows in another semiconductor layer that are located adjacent to the first rows R1. For example, as shown in FIGS. 8 and 9, the first-second connection lines CAL1-2 may be connected to one end portion of each of the third rows R3 and/or the fourth rows R4.

In FIGS. 8 and 9, the first connection line includes both the first-first connection line CAL1-1 and the first-second connection line CAL1-2, but the embodiments are not limited thereto. In one or more embodiments, the first connection line may include only the first-first connection line CAL1-1 or include only the first-second connection line CAL1-2. However, when the first connection line includes both the first-first connection line CAL1-1 and the first-second connection line CAL1-2, the load deviation may be more efficiently reduced.

Similarly, the second rows R2 may respectively include first end portions and second end portions that are opposite to the first end portions, a second-first connection line CAL2-1 may be connected to each of the first end portions of the second rows R2, and a second-second connection line CAL2-2 may be connected to each of the second end portions of the second rows R2. The second-first connection line CAL2-1 may be located to be relatively adjacent to the first area OA, and the second-second connection line CAL2-2 may be located to be relatively apart from (e.g., not directly adjacent to) the first area OA.

The second-first connection line CAL2-1 and the second-second connection line CAL2-2 may be respectively connected to the second rows R2, and the second-second connection line CAL2-2 may extend further in the second direction (e.g., the x-direction) to be connected to rows in another semiconductor layer that are located adjacent to the second rows R2. For example, as shown in FIGS. 8 and 9, the second-second connection line CAL2-2 may be connected to another portion in each of the third rows R3 and/or the fourth rows R4.

In FIGS. 8 and 9, the second connection line includes both the second-first connection line CAL2-1 and the second-second connection line CAL2-2, but the embodiments are not limited thereto. In one or more embodiments, the second connection line may only include the second-first connection line CAL2-1 or only include the second-second connection line CAL2-2. In terms of reducing the load deviation, it may be preferable that the second connection line includes both the second-first connection line CAL2-1 and the second-second connection line CAL2-2.

Figure 10A:
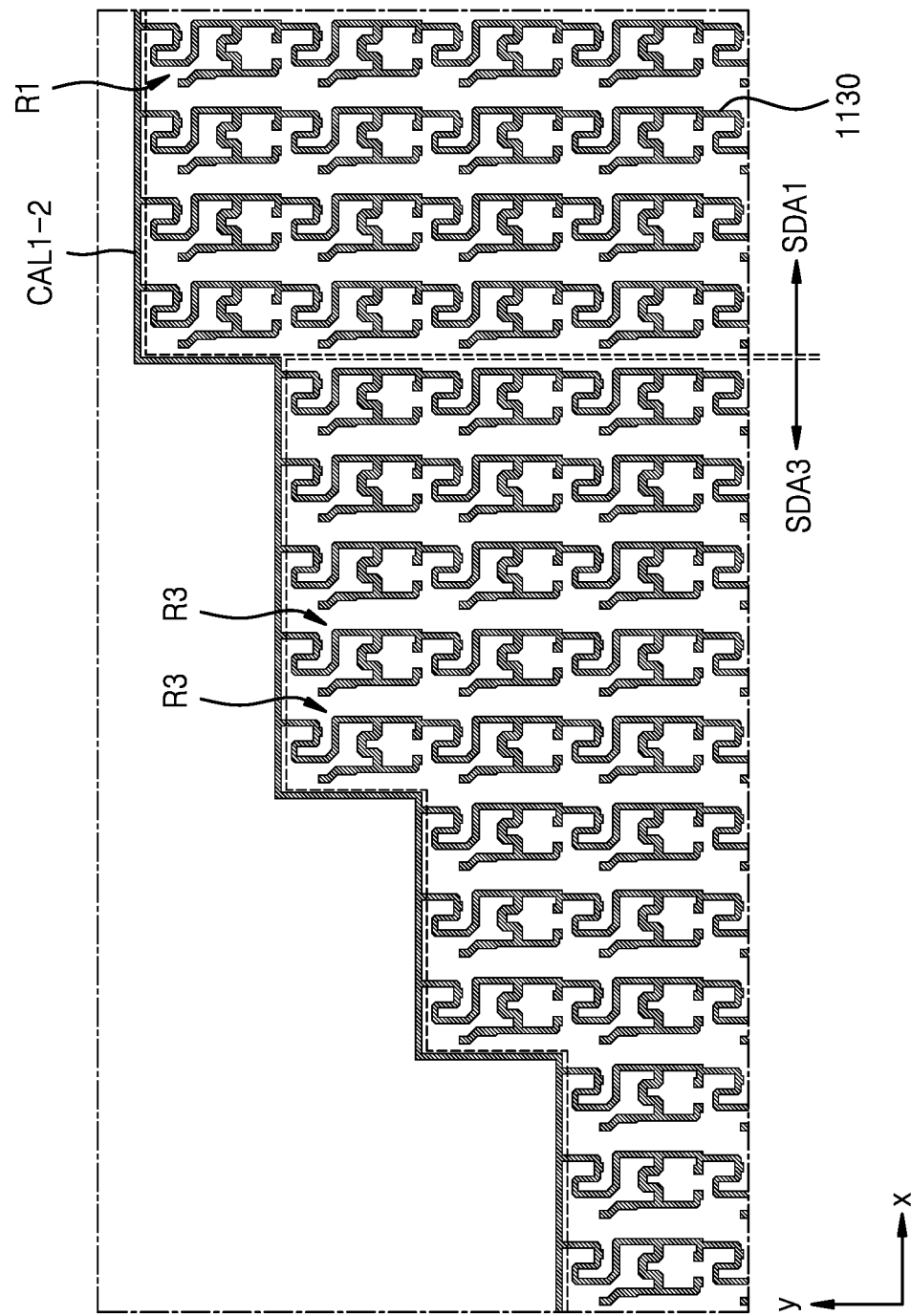
FIGS. 10A and 10B are each a top-plan view showing a portion of a display panel according to an embodiment.
Figure 10B:
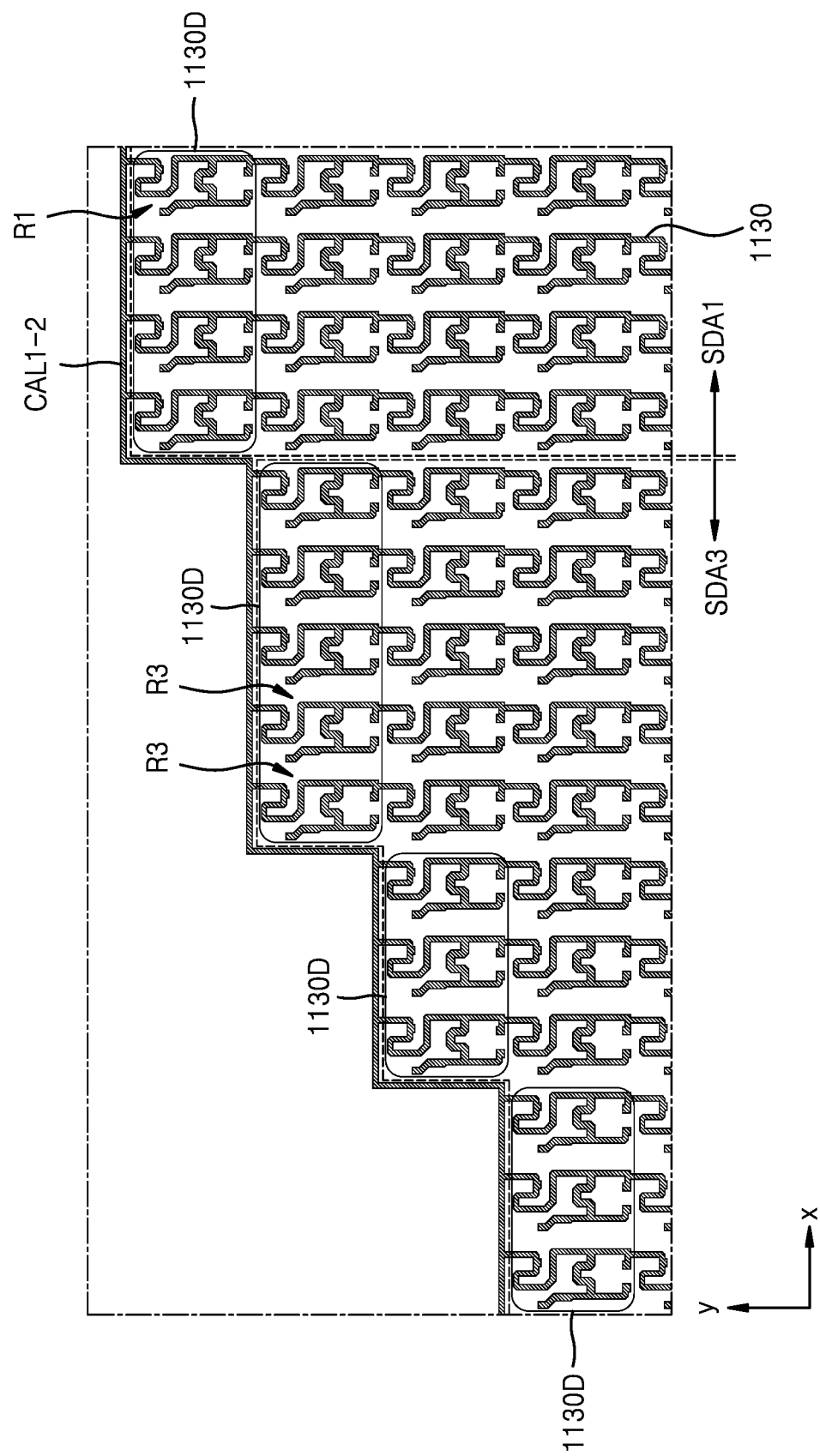

FIGS. 10A and 10B are top-plan views each showing a portion of the display panel 10 according to an embodiment and correspond to an enlarged view of X portion shown in FIG. 8.

Referring to FIGS. 8, 10A, and 10B, a corner portion of the display area DA may be rounded (see FIG. 8), and the semiconductor layers 1130 at the corner portion have a stepwise configuration (see FIGS. 10A and 10B).

A plurality of semiconductor layers may be arranged in the display area DA, in which each semiconductor layer in each row may be an effective semiconductor layer. Here, an effective semiconductor layer indicates a semiconductor layer on which transistors for operating each pixel are formed, in other words, a semiconductor layer in which pixel circuits are formed. In an embodiment, some of the semiconductor layers arranged in the rows may be dummy semiconductor layers 1130D. For example, as shown in FIG. 10B, each of the first rows R1 includes a dummy semiconductor layer 1130D located at a side of an end portion of the first row R1, and each of the third rows R3 may include the dummy semiconductor layer 1130D located at a side of an end portion of the third row R3.

Figure 11:
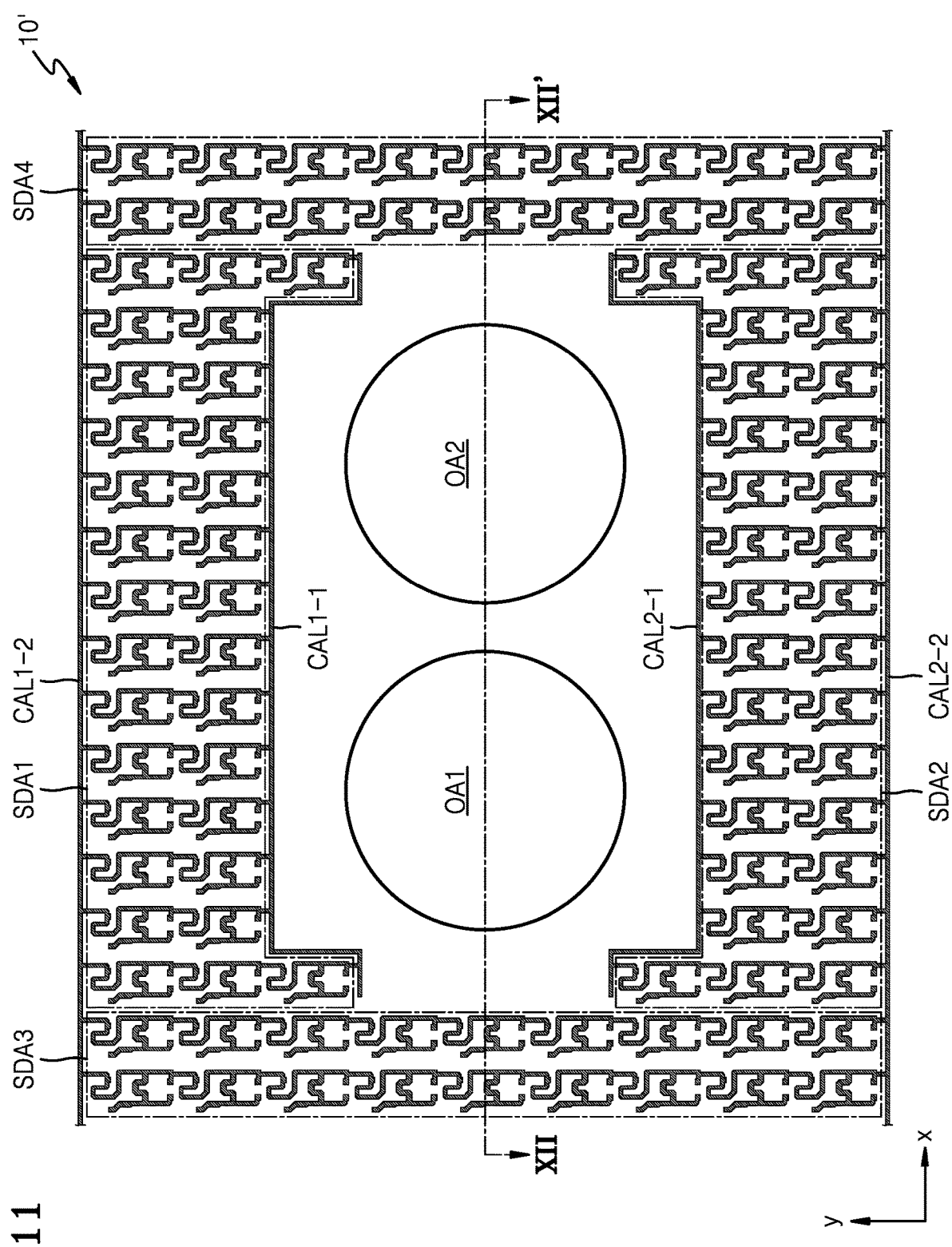
FIG. 11 is an excerpt of a top-plan view of semiconductor layers included in each of pixels arranged near a first area in a display panel according to another embodiment.

FIG. 11 is a top-plan view of semiconductor layers included in each of the pixels arranged around the first area in the display panel 10 according to an embodiment, and FIGS. 12A-12D are each a cross-sectional view of the display panel 10', taken along the line XII-XII' shown in FIG. 11.

The display panel 10' may include a plurality of first areas. In this regard, FIG. 11 shows two first areas OA1 and OA2. As other features except for the number of the first areas OA1 and OA2 are same as those of the display panel 10 described with reference to FIGS. 8 and 9, differences between the display panel 10 and the display panel 10' may be described hereinafter.

Figure 12A:
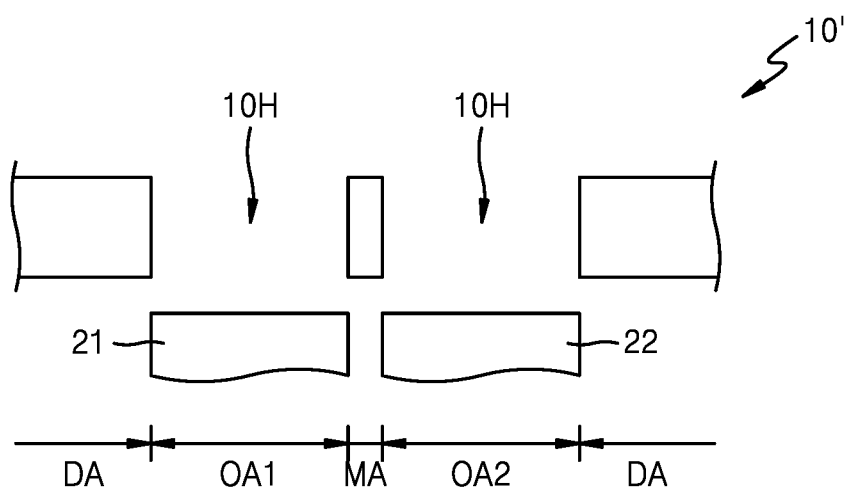
FIGS. 12A-12D are each a cross-sectional view of a display panel taken along the line XII-XII' shown in FIG. 11.
Figure 12B:
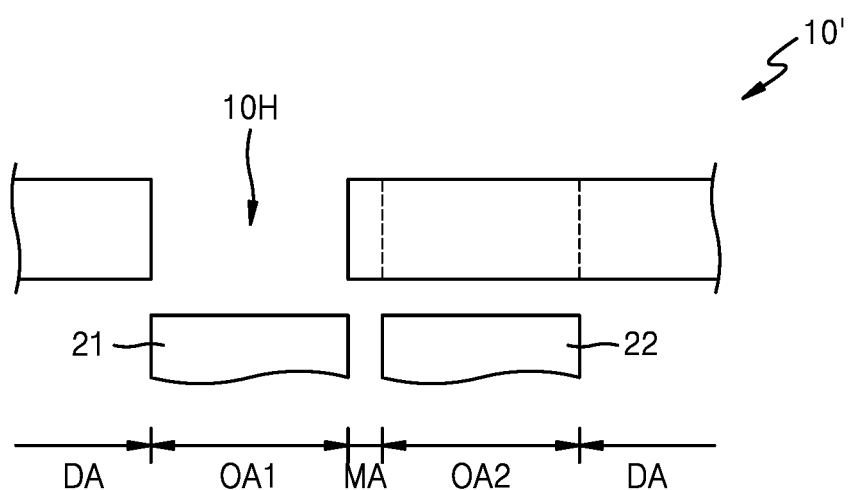
Figure 12C:
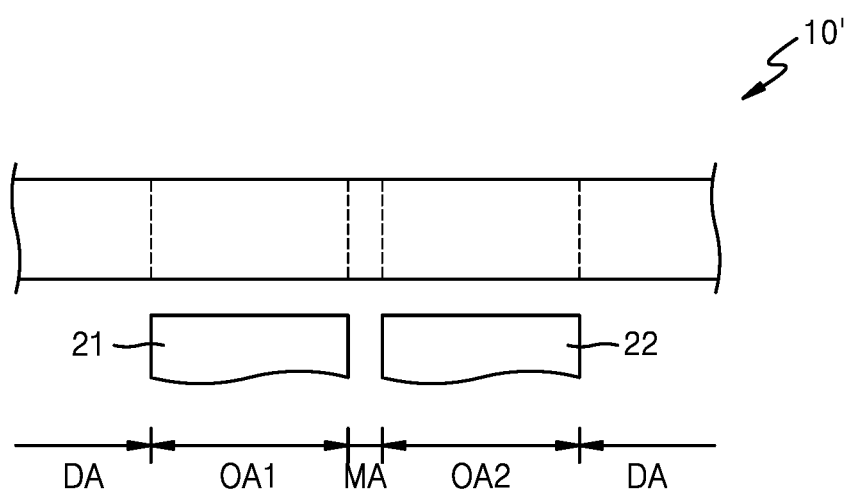

Referring to FIG. 12A, the display panel 10' may include the first opening 10H that is located in each of the first areas OA1 and OA2. In an embodiment, as shown in FIG. 12B, the display panel 10' may include the first opening 10H that is located in one of the first areas OA1 and OA2, and no opening may be provided in the other of the first areas OA1 and OA2. In an embodiment, as shown in FIG. 12C, the display panel 10' may not include an opening that corresponds to the first areas OA1 and OA2.

Each of the first areas OA1 and OA2 may be an area in which a component is located. In this regard, FIGS. 12A-12C show a first component 21 and a second component 22. The first component 21 and the second component 22 may respectively include different elements. For example, one of the first component 21 and the second component 22 may include a camera, a speaker, and the like, and the other of the first component 21 and the second component 22 may include a sensor. In an embodiment, the first component 21 and the second component 22 may include like components.

Figure 12D:
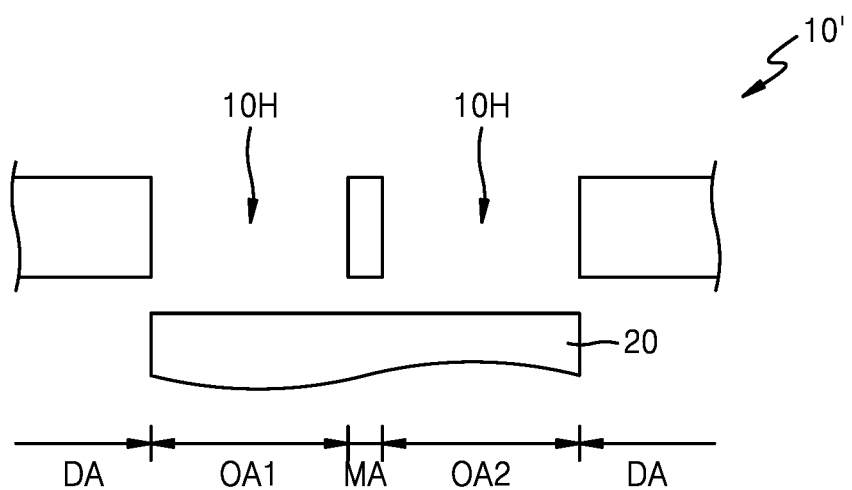

In an embodiment, as shown in FIG. 12D, one component 20 may be located to overlap a plurality of first areas (e.g., the first areas OA1 and OA2).

Figure 13:
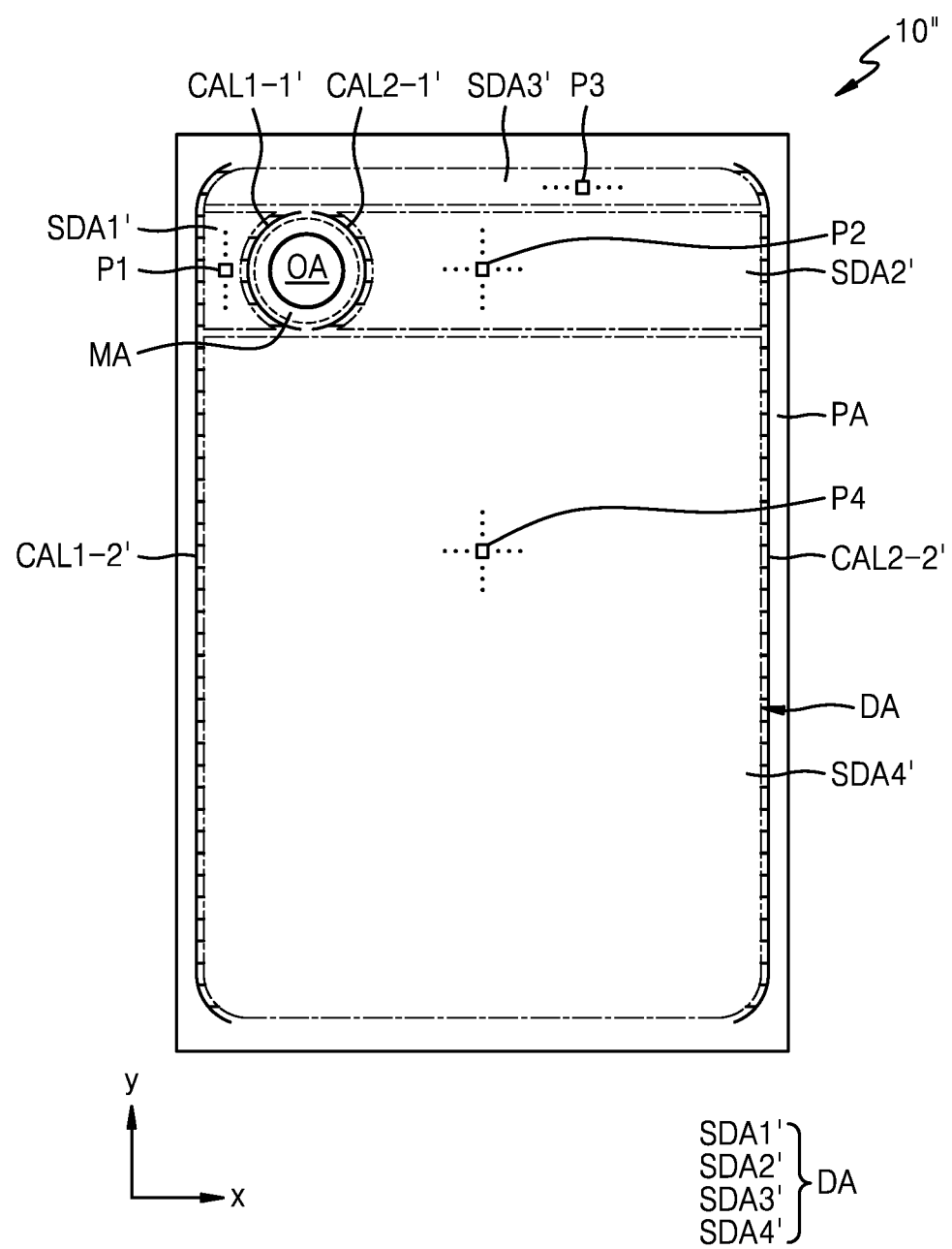
FIG. 13 is a schematic top-plan view showing a display panel according to another embodiment.
Figure 14:
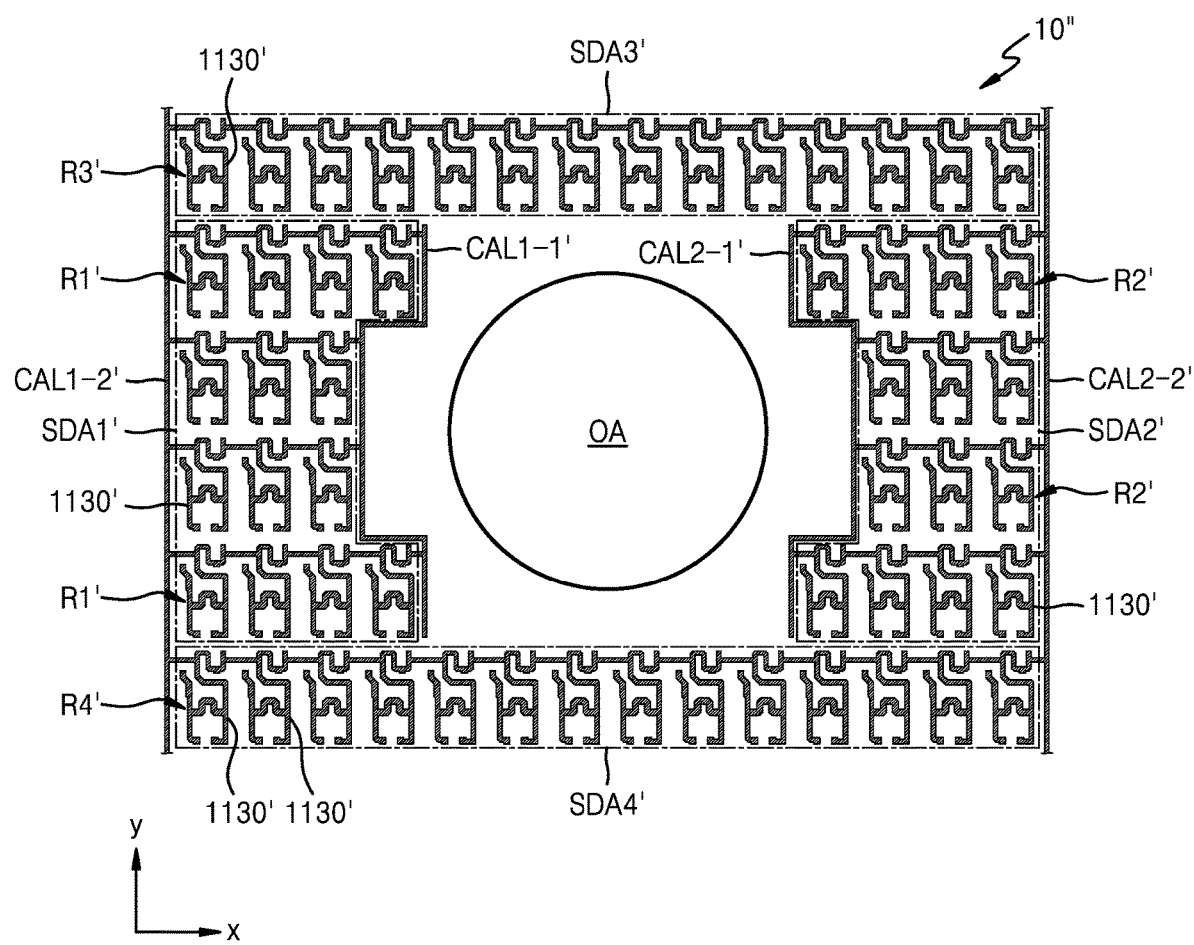
FIG. 14 is an excerpt of a top-plan view showing semiconductor layers included in each of pixels arranged near a first area in a display panel according to another embodiment.

FIG. 13 is a schematic top-plan view of a display panel 10″ according to an embodiment, and FIG. 14 is an excerpt of a top-plan view of selected semiconductor layers included in each of the pixels arranged around a first area in the display panel 10″ according to an embodiment.

According to the embodiments described with reference to FIGS. 8-11, the semiconductor layers are connected to one another in the y-direction, but the embodiments are not limited thereto. As shown in FIGS. 13 and 14, the semiconductor layers may be connected to one another in the x-direction.

Referring to FIG. 13, a plurality of pixels are arranged in the display area DA. The plurality of pixels may include first pixels P1 arranged in a first sub-display area SDA1', second pixels P2 arranged in a second sub-display area SDA2', third pixels P3 arranged in a third sub-display area SDA3', and fourth pixels P4 arranged in a fourth sub-display area SDA4'. The first pixels P1, the second pixels P2, the third pixels P3, and the fourth pixels P4 may each include the pixel circuit that is described above with reference to FIG. 6A, and the semiconductor layers may be connected to one another in the x-direction as shown in FIG. 14.

Referring to FIGS. 13 and 14, each of the first pixels P1 corresponding to the first sub-display area SDA1' may include a semiconductor layer 1130', and the semiconductor layers 1130' in the first pixels P1 may be connected to one another in the x-direction and form the plurality of first rows R1' as shown in FIG. 14. That is, each of the first rows R1' includes the plurality of semiconductor layers 1130 connected to one another in the x-direction. Likewise, the second pixels P2, the third pixels P3, and the fourth pixels P4 each include the semiconductor layer 1130', and as shown in FIG. 14, the semiconductor layers 1130' may be connected to one another in the x-direction and form the second rows R2', the third rows R3', and the fourth rows R4'.

Each of the third rows R3' and the fourth rows R4' extends (e.g., extend continuously) in the x-direction across the display area DA as shown in FIG. 14. On the contrary, the first rows R1' and the second rows' R2 are arranged to be apart (e.g., spaced apart) from one another with the first area OA therebetween, and accordingly, a length (e.g., in the x-direction) of each of the first rows R1' and the second rows R2' may be less than a length of the third row R3' or the fourth row R4'. In order to reduce a load deviation according to the structural difference, the display panel 10″ may include a connection line that connects rows in the semiconductor layer. In this regard, FIG. 14 shows a first connection line that connects the first rows R1' to one another and a second connection line that connects the second rows R2' to one another.

The first connection line may include a first-first connection line CAL1-1' connected to a first end portion of each of the first rows R1' and/or a first-second connection line CAL1-2' connected to a second end portion of each of the first rows R1'. The first connection line CAL1-1' may be located to be relatively adjacent to the first area OA, and the first-second connection line CAL1-2' may be located to be relatively apart from (e.g., not directly adjacent to) the first area OA. Similarly to the first-second connection line CAL1-2 described with reference to FIG. 9, the first-second connection line CAL1-2' may be connected to rows in semiconductor layers included in other groups arranged adjacent to the first pixels P1, for example, a group of the third pixels P3 and/or a group of the fourth pixels P4. For example, as shown in FIGS. 13 and 14, the first-second connection line CAL1-2' may extend in the second direction (e.g., the y-direction) and be connected to one end portion of each of the third rows R3' and the fourth rows R4'.

The second connection line may include a second-first connection line CAL2-1' that is connected to a first end portion of each of the second rows R2' and/or a second-second connection line CAL2-2' that is connected to a second end portion of each of the second rows R2'. The second-first connection line CAL2-1' may be located to be relatively adjacent to the first area OA, and the second-second connection line CAL2-2' may be located to be relatively apart from (e.g., not directly adjacent to) the first area OA. Like the second-second connection line CAL2-2 described above with reference to FIG. 9, the second-second connection line CAL2-2' may be connected to the rows in the semiconductor layers which are included in the other groups arranged adjacent to the first pixels P1, for example, the group of third pixels P3 and/or the group of fourth pixels P4. For example, as shown in FIGS. 13 and 14, the second-second connection lines CAL2-2' may be connected to another end portion of each of the third rows R3' and the fourth rows R4'.

In FIGS. 13 and 14, the display panel 10″ includes the first connection line and the second connection line, but the embodiments are not limited thereto. In an embodiment, only one of the first connection line and the second connection line may be provided in the display panel 10″.

In FIGS. 13 and 14, the first connection line includes the first-first connection line CAL1-1' and the first-second connection line CAL1-2', however, in one or more embodiments, the display panel 10″ may include one of the first-first connection line CAL1-1' and the first-second connection line CAL1-2'. Similarly, FIGS. 13 and 14 show that the second connection line includes the second-first connection line CAL2-1' and the second-second connection line CAL2-2'. However, in one or more embodiments, the display panel 10″ may include one of the second-first connection line CAL2-1' and the second-second connection line CAL2-2'.

Figure 15:
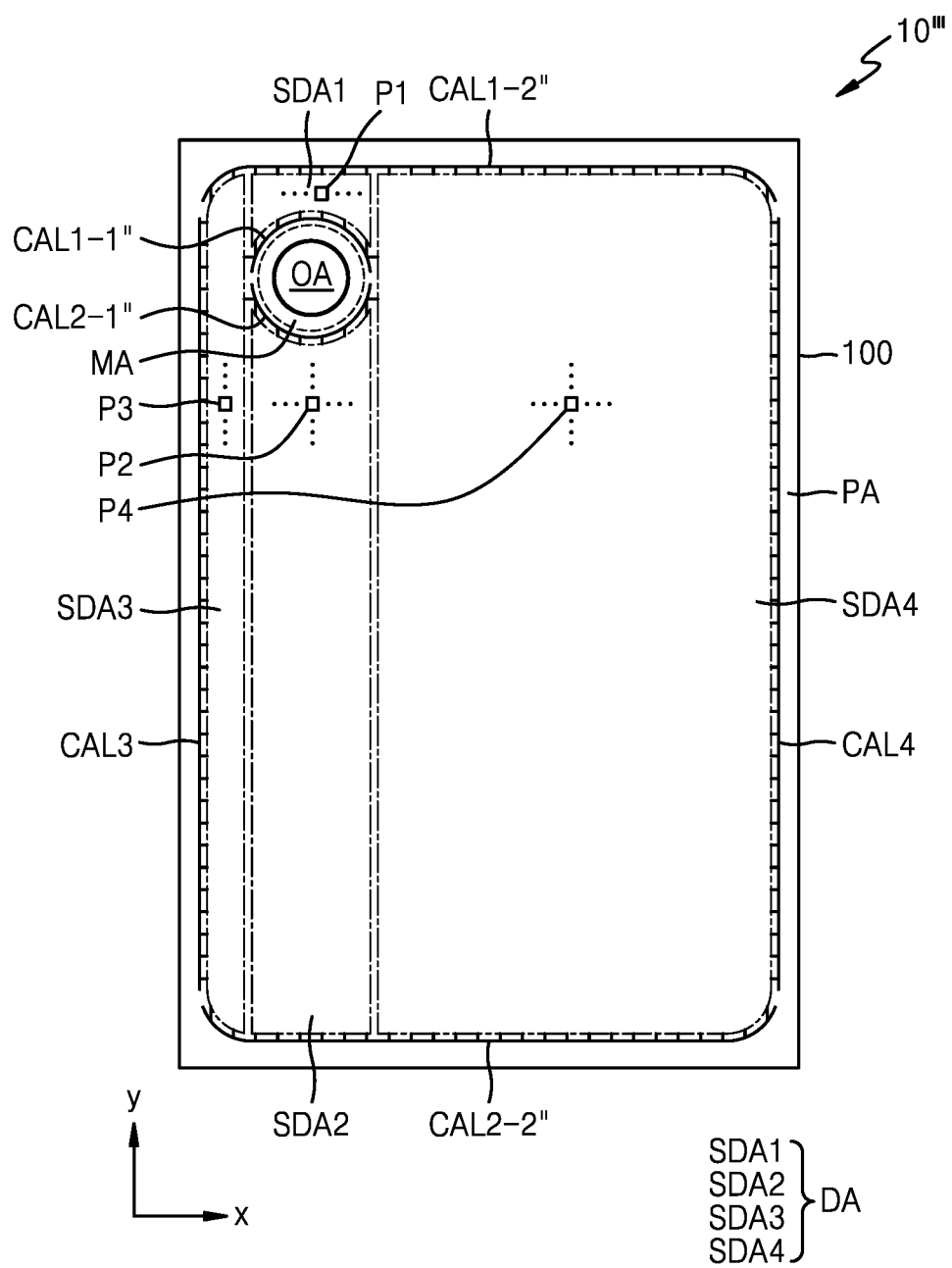
FIG. 15 is a top-plan view showing a display panel according to another embodiment.
Figure 16:
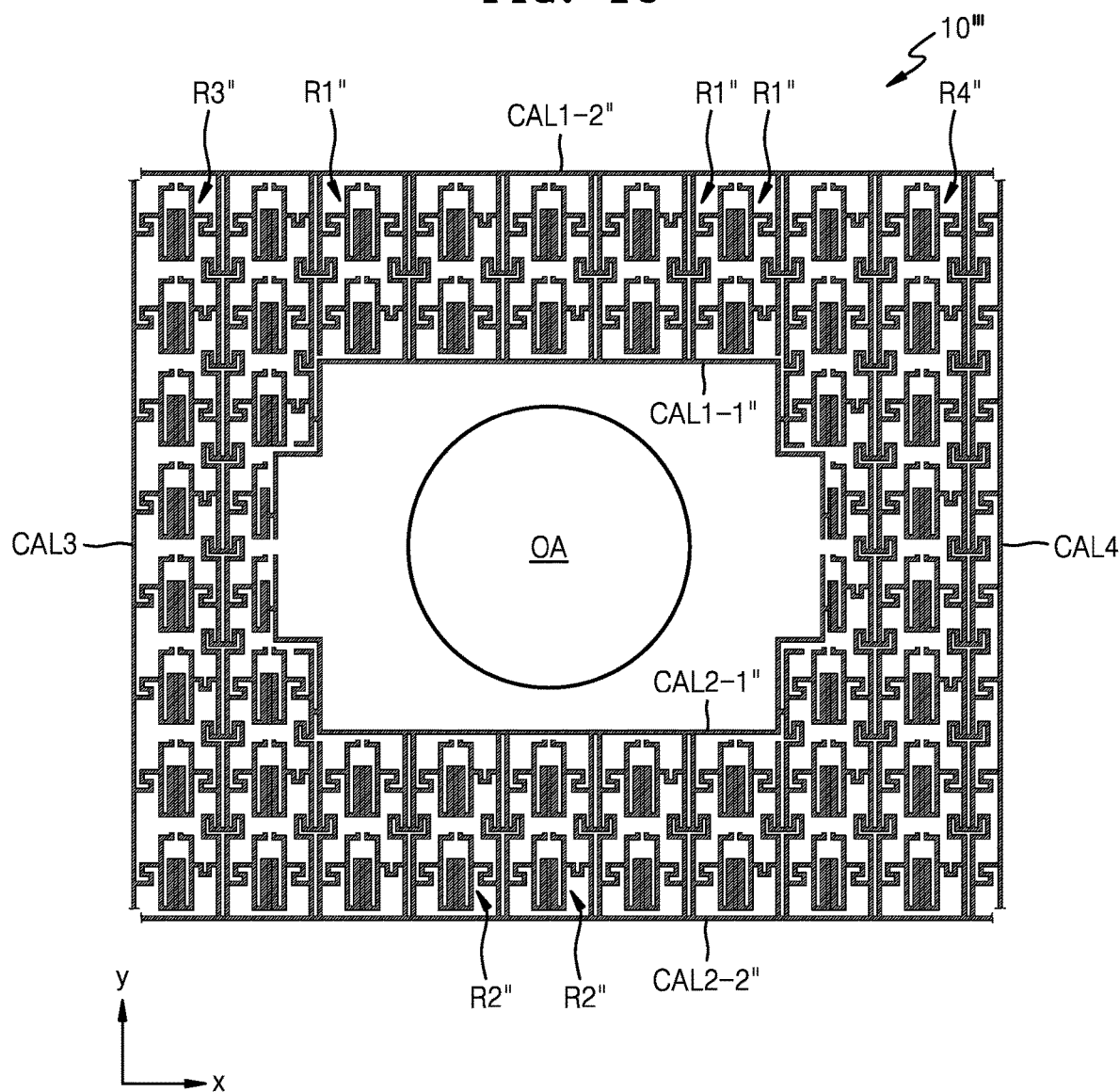
FIG. 16 is a top-plan view showing semiconductor layers arranged near a first area in a display panel according to an embodiment.

FIG. 15 is a top-plan view showing a display panel 10‴ according to an embodiment, and FIG. 16 is a top-plan view showing semiconductor layers which are arranged around the first area in the display panel 10″ according to an embodiment.

Referring to FIG. 15, the display panel 10‴ may include a first-first connection line CAL1-1″, a first-second connection line CAL1-2″, a second-first connection line CAL2-1″ and/or a second-second connection line CAL2-2″. The first-second connection line CAL1-2″ and the second-second connection line CAL2-2″ are respectively identical to or substantially similar to the first-second connection line CAL1-2 and the second-second connection line CAL2-2 described with reference to FIGS. 8 and 9, and differences thereof may be described hereinafter.

The first-first connection line CAL1-1″ may be connected not only to first rows R1″ of the semiconductor layers arranged in the first sub-display area SDA1 but may also be connected to third rows R3″ of the semiconductor layers which are arranged in the third sub-display area SDA3 that is adjacent to the first sub-display area SDA1 and/or fourth rows R4″ of the semiconductor layers which are arranged in the fourth sub-display area SDA4. Likewise, the second-first connection line CAL2-1″ may be connected not only to second rows R2″ of the semiconductor layers which are arranged in the second sub-display area SDA but also to the third rows R3″ of the semiconductor layers arranged in the third sub-display area SDA3 that is adjacent to the second sub-display area SDA2 and/or the fourth rows R4" of the semiconductor layers which are arranged in the fourth sub-display area SDA4.

Each of the first rows R1" in the semiconductor layers may extend in the y-direction and be connected to a neighboring row in the x-direction. For example, as shown in FIG. 16, any one of the first row R1" may be connected to neighboring first rows R1" or to a third row R3" or a fourth row R4" neighboring the first row R1". Likewise, the second row R2", the second row R3", and the fourth row R4" may each extend in the y-direction and be connected to a neighboring row in the x-direction. As described above, when each of the first rows R1", the second rows R2", the third rows R3", and the fourth rows R4" is connected to a neighboring row, the semiconductor layers may be connected to one another in the x-direction or the y-direction.

The display panel 10''' may further include a third connection line CAL3 and/or a fourth connection line CAL4 that extend in the y-direction, and the third connection line CAL3 and the fourth connection line CAL4 may respectively be connected to the third rows R3" and the fourth rows R4".

FIGS. 15 and 16 show a structure in which the semiconductor layers are connected to one another in the y-direction to form rows and the neighboring rows are connected to one another in the x-direction, that is, a structure in which the semiconductor layers are connected in the y-direction and the x-direction, but the embodiments are not limited thereto. For example, the features of the first-first connection line CAL1-1" and the second-first connection line CAL2-1" described with reference to FIGS. 15 and 16 may also be applied to the display panel 10 that is described above with reference to FIGS. 8 and 9.

According to the embodiments, non-uniformity in luminance occurring in each portion of the display area in the display panel which includes a first area in the inner portion of the display area may be prevented or reduced.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various suitable changes in form and details may be made therein without departing from the spirit and scope as defined by the following claims, and equivalents thereof.

What is claimed is:

1. A display panel comprising:
a substrate comprising a display area and a first area in the display area; and
a plurality of pixels in the display area and surrounding the first area, each of the plurality of pixels being configured to emit light,
wherein the plurality of pixels comprises a first group of first pixels adjacent to the first area, and each of the first pixels comprises a first semiconductor layer,
wherein the first semiconductor layer of each of the first pixels is connected to the first semiconductor layer of another one of the first pixels in a first direction to form a first row arranged on the substrate, and
wherein the first row is connected to a first connection line extending in a second direction that crosses the first direction.

2. The display panel of claim 1, wherein the first row comprises a first end portion adjacent to the first area and a second end portion opposite to the first end portion, and
the first connection line is connected to at least one of the first end portion and the second end portion.

3. The display panel of claim 1, wherein the plurality of pixels comprises a first neighboring pixel group adjacent to the first group, and each of the pixels in the first neighboring pixel group comprises a semiconductor layer,
wherein the semiconductor layer of each of the pixels in the first neighboring pixel group is connected to the semiconductor layer of another one of the pixels in the first neighboring pixel group in the, first direction to form a plurality of rows arranged on the substrate, and
wherein the first connection line is connected to the plurality of rows in the first neighboring pixel group.

4. The display panel of claim 3, wherein a total area of the first semiconductor layers in the first group is different from a total area of the semiconductor layers in the first neighboring pixel group.

5. The display panel of claim 1, wherein the first connection line and the first semiconductor layers comprise a same material.

6. The display panel of claim 1, wherein the plurality of pixels further comprises a second group of second pixels spaced apart from the first group of first pixels with the first area between the first group and the second group,
wherein each of the second pixels comprises a second semiconductor layer, and
wherein the second semiconductor layer of each of the second pixels is connected to the second semiconductor layer of another one of the second pixels in the first direction to form a plurality of second rows arranged on the substrate.

7. The display panel of claim 6, further comprising a second connection line extending in the second direction, and each of the plurality of second rows is connected to the second connection line.

8. The display panel of claim 7, wherein each of the plurality of second rows comprises a first end portion adjacent to the first area and a second end portion opposite to the first end portion, and
wherein the second connection line is connected to at least one of the first end portion and the second end portion of each of the plurality of second rows.

9. The display panel of claim 7, wherein the plurality of pixels further comprises a second neighboring pixel group adjacent to the second group, and each of the pixels in the second neighboring pixel group comprises a semiconductor layer,
wherein the semiconductor layer of each of the pixels in the second neighboring pixel group is connected to the semiconductor layer of another one of the pixels in the second neighboring pixel group in the first direction to form a plurality of rows arranged on the substrate, and
wherein the second connection line is connected to the plurality of rows in the second neighboring pixel group.

10. The display panel of claim 7, wherein the second connection line and the second semiconductor layers comprise a same material.

11. A display panel comprising:
a substrate comprising a first area and a second area;
a plurality of rows in the second area, the first area surrounded by the second area in which the plurality of rows is located, the plurality of rows comprising:
a plurality of first rows in the second area and configured to drive the display panel to emit light, each of the first rows comprising a plurality of first semiconductor layers connected to one another in a first direction; and a plurality of second rows in the second area, each of the second rows comprising a plurality of second semiconductor layers connected to one another in, the first direction; and a first connection line that is connected to the plurality of first rows and extends in a second direction that crosses the first direction.

12. The display panel of claim 11, wherein the first connection line and the plurality of first semiconductor layers comprise a same material.

13. The display panel of claim 11, wherein each of the first rows comprises a first end portion adjacent to the first area and a second end portion opposite to the first end portion, and wherein the first connection line is connected to at least one of the first end portion and the second end portion.

14. The display panel of claim 11, further comprising a plurality of first neighboring rows that is adjacent to the plurality of first rows, each of the first neighboring rows comprising a plurality of semiconductor layers that is connected to one another in the first direction, wherein the first connection line is connected to the plurality of first neighboring rows.

15. The display panel of claim 14, wherein the plurality of first semiconductor layers and the plurality of semiconductor layers are respectively connected to neighboring first semiconductor layers or semiconductor layers in the second direction.

16. The display panel of claim 11, wherein the plurality of first rows and the plurality of second rows are apart from one another with, the first area between the plurality of first rows and the plurality of second rows.

17. The display panel of claim 16, wherein the plurality of first semiconductor layers and the plurality of second semiconductor layers are arranged stepwise in an area adjacent to the first area.

18. The display panel of claim 11, further comprising a second connection line connected to the plurality of second rows and extending in the second direction that crosses the first direction.

19. The display panel of claim 18, wherein the second connection line and the plurality of second semiconductor layers comprise a same material.

20. The display panel of claim 18, further comprising a plurality of second neighboring rows that is adjacent to the plurality of second rows, each of the second neighboring rows comprising a plurality of second semiconductor layers that are connected to one another in the first direction, wherein the second connection line is connected to the plurality of second neighboring rows.

* * * * *